US010127272B2

(12) United States Patent
Tremayne et al.

(10) Patent No.: US 10,127,272 B2
(45) Date of Patent: Nov. 13, 2018

(54) MODIFYING A DATABASE QUERY

(71) Applicant: Oracle International Corporation, Redwood Shores, CA (US)

(72) Inventors: Andy Tremayne, Berkshire (GB); Michael Raymond, Orlando, FL (US)

(73) Assignee: Oracle International Corporation, Redwood Shores, CA (US)

( * ) Notice: Subject to any disclaimer, the term of this patent is extended or adjusted under 35 U.S.C. 154(b) by 302 days.

(21) Appl. No.: 15/077,649

(22) Filed: Mar. 22, 2016

(65) Prior Publication Data

US 2017/0277747 A1 Sep. 28, 2017

(51) Int. Cl.
*G06F 17/30* (2006.01)
*H03M 7/30* (2006.01)

(52) U.S. Cl.
CPC .. *G06F 17/30395* (2013.01); *G06F 17/30292* (2013.01); *G06F 17/30312* (2013.01); *G06F 17/30486* (2013.01); *H03M 7/60* (2013.01)

(58) Field of Classification Search
USPC .......................... 707/758, 759, 765, 768, 713
See application file for complete search history.

(56) References Cited

U.S. PATENT DOCUMENTS

2013/0232133 A1* 9/2013 Al-Omari ......... G06F 17/30498 707/714
2015/0199404 A1* 7/2015 Elias ................. G06F 17/30451 707/718

OTHER PUBLICATIONS

Oracle, "Oracle® Database, VLDB and Partitioning Guide, 11g Release 1 (11.1), B32024-01," Accessed at http://docs.oracle.com/cd/B28359_01/server.111/b32024/partition.htm, 16 pages, Jul. 2007.
Oracle, "Oracle® Database, Security Guide, 11g Release 1 (11.1), B28531-21, Ch 7—Using Oracle Virtual Private Database to Control Data Access," Accessed at https://docs.oracle.com/cd/B28359_01/network.111/b28531/vpd.htm, 42 pages, Jan. 2014.
Nanda, A., "Partition Decisions," Oracle Magazine, Technology: Partitioning, Accessed at http://www.oracle.com/technetwork/issue-archive/2006/06-sep/o56partition-090450.html, 8 pages, Sep. 2006.

* cited by examiner

*Primary Examiner* — Hung T Vy
(74) *Attorney, Agent, or Firm* — Invoke

(57) ABSTRACT

Techniques for modifying a database query are disclosed. A source and/or time associated with an initial database query for execution on a database are determined. A modification of the initial database query is determined based on the source and/or time. The modification includes adding a filter to the initial database query. The modified database query is executed to return a set of results. Optionally, partitions of the database that are relevant to the modified database query may be selected. The modified database query may be executed on only the relevant partitions. The datasets included in the results to the modified database query may be more important, relevant, and/or valuable to a user than the datasets that were excluded based on the filter. The datasets included in the results may be retrieved from faster data storage than the excluded datasets.

20 Claims, 8 Drawing Sheets

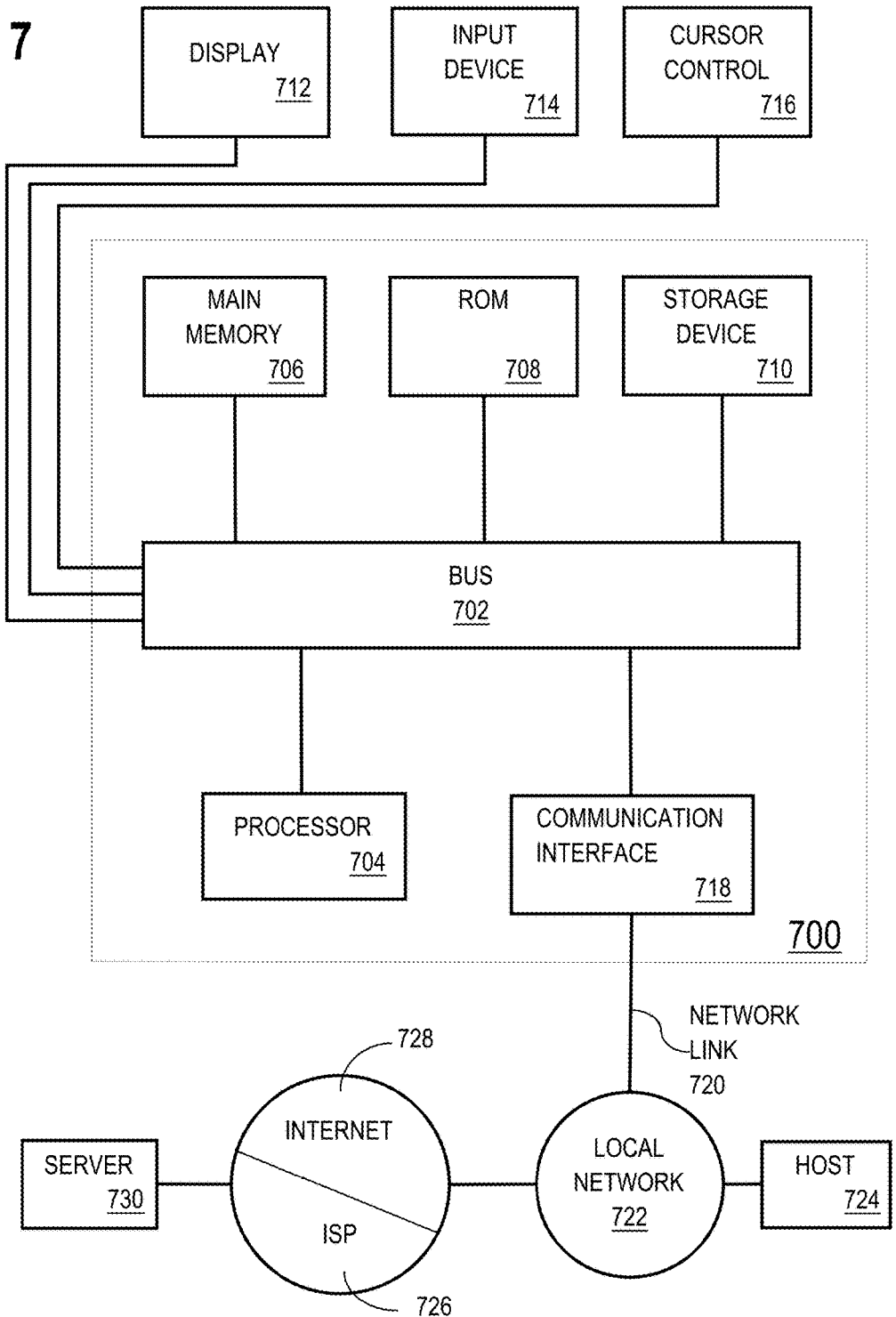

MODIFYING A DATABASE QUERY

TECHNICAL FIELD

The present disclosure relates to database queries. In particular, the present disclosure relates to modifying database queries for execution on a database.

BACKGROUND

A database includes one or more datasets organized according to a schema. Datasets of a database may be associated with different characteristics. As an example, a database may include datasets that were generated and/or last accessed within different time periods. A database may include datasets that are accessed with different frequencies. A database may include datasets that are associated with different users, devices, applications, and/or tenants. A database may store the datasets across different storage devices of different types.

A database query is a request for all or a subset of information from a particular database. The database query specifies the particular subset of information to be returned based on one or more criteria. As an example, a database query may request that information corresponding to any datasets that satisfy a particular criterion be returned. As another example, a database query may request that information corresponding to one or more particular data fields of a schema of a database be returned.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The embodiments are illustrated by way of example and not by way of limitation in the figures of the accompanying drawings. It should be noted that references to "an" or "one" embodiment in this disclosure are not necessarily to the same embodiment, and they mean at least one. In the drawings:

FIG. 7 shows a block diagram that illustrates a computer system in accordance with one or more embodiments.

DETAILED DESCRIPTION

Figure 1:
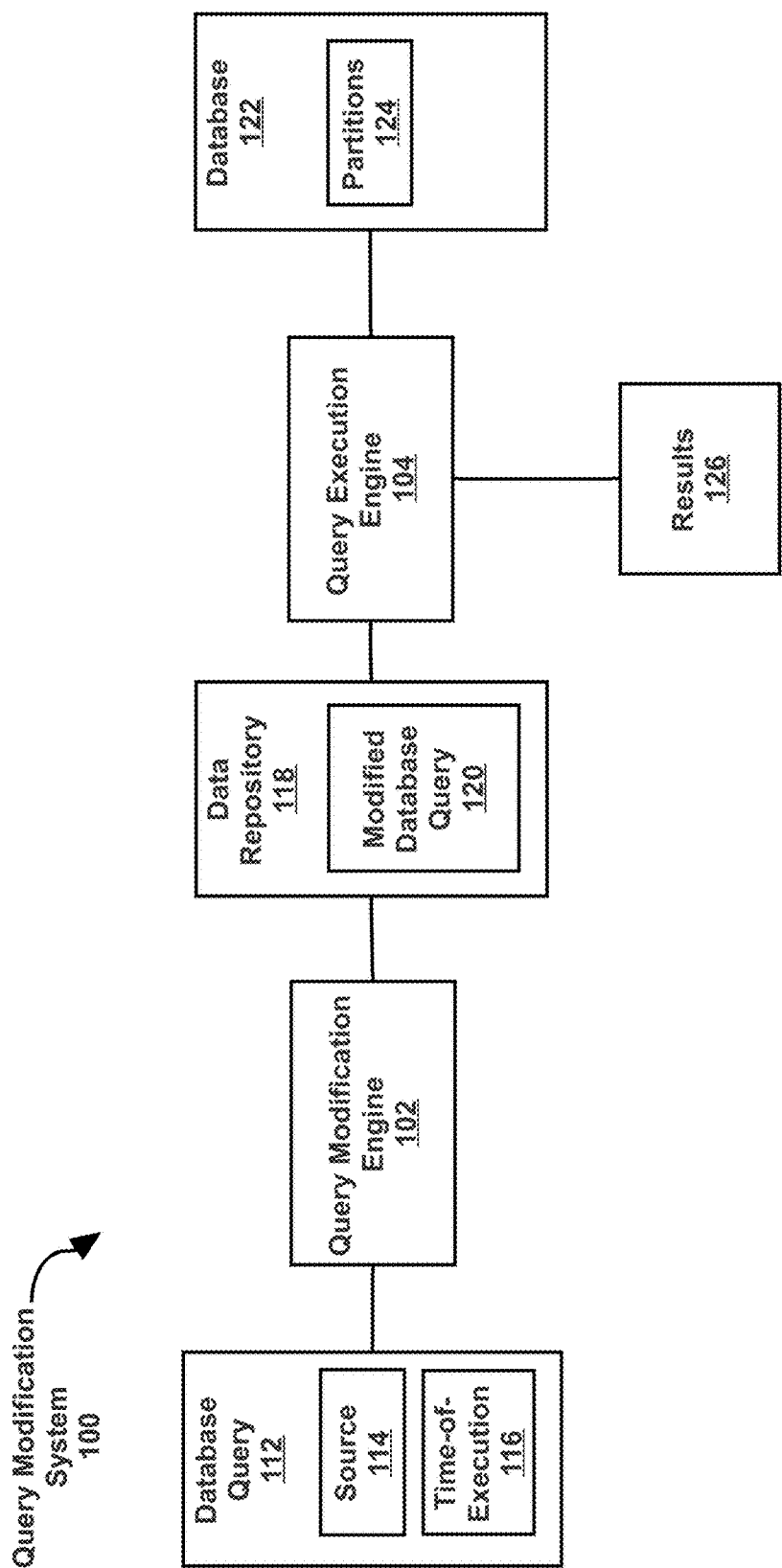
FIG. 1 illustrates a query modification system, in accordance with one or more embodiments.

In the following description, for the purposes of explanation, numerous specific details are set forth in order to provide a thorough understanding. One or more embodiments may be practiced without these specific details. Features described in one embodiment may be combined with features described in a different embodiment. In some examples, well-known structures and devices are described with reference to a block diagram form in order to avoid unnecessarily obscuring the present invention.

1. GENERAL OVERVIEW
2. QUERY MODIFICATION ARCHITECTURE
3. SELECTING A PARTITION OF A DATABASE FOR STORING A DATASET BASED ON A CHARACTERISTIC OF THE DATASET
4. MODIFYING A DATABASE QUERY BASED ON A SOURCE AND/OR TIME-OF-EXECUTION CORRESPONDING TO THE DATABASE QUERY
5. MODIFYING A DATABASE QUERY TO TEST FUNCTIONALITY AND/OR PERFORMANCE OF A DATABASE PRIOR TO PURGING A DATASET
6. MODIFYING A DATABASE QUERY TO TEST FUNCTIONALITY AND/OR PERFORMANCE OF A DATABASE PRIOR TO ARCHIVING A DATASET
7. DISTRIBUTING CATEGORIES OF DATASETS TO PARTICULAR NODES OF A TARGET SYSTEM
8. TESTING AN APPLICATION ON A REDUCED PORTION OF A PRODUCTION DATABASE
9. ENFORCING A SECURITY POLICY
10. EXAMPLE EMBODIMENT: MODIFYING A DATABASE QUERY FOR AN INFORMATION LIFECYCLE MANAGEMENT SYSTEM
11. CLOUD ENVIRONMENTS
12. MISCELLANEOUS; EXTENSIONS
13. HARDWARE OVERVIEW

1. General Overview

One or more embodiments include modifying a database query based on a source corresponding to the database query. A system receives a database query for execution on a database. The database query, if executed, may return a set of results that includes both information that is relevant to a source of the database query and information that is not relevant (or less relevant) to the source. As an example, the information may be irrelevant because the information is associated with an entity that is different than the source from which the database query was received. A filter is appended to the database query to exclude the irrelevant information. The filter is determined based on the source. As an example, a source may be a program or an employee of a particular Human Resources (HR) Department. A filter determined based on the source would include datasets relating to the particular HR department. The filter would exclude datasets of other departments. The modified database query, with the added filter, is executed on the database (or one or more partitions of the database) to obtain a set of results.

One or more embodiments include modifying a database query based on a time at which the database query was received and/or generated. A system receives a database query for execution on a database. The database query, if executed, may return a set of results from any time period. However, datasets generated or last-modified prior to a recent time period may be irrelevant (or less relevant). A filter is appended to the database query to exclude datasets that were generated, accessed, and/or last-modified prior to the recent time period. The particular time period is referenced with respect to the time at which the database query was received and/or generated. As an example, datasets that have not been modified in the past five years may be irrelevant. A filter may exclude datasets that have a "Last Modified Date" more than five years prior to the time a database query is received. If a particular database query is received on Feb. 1, 2016, then the filter would exclude datasets that have a "Last Modified Date" prior to Feb. 1, 2011 (five years prior to Feb. 1, 2016). The modified database query, with the added filter, is executed on the database (or one or more partitions of the database) to obtain a set of results.

One or more embodiments include executing a modified database query on partition(s) of a database that are relevant to the modified database query. The modified database query is not executed on other partition(s) of the database that are not relevant to the modified database query. The database may be stored across storage devices with faster access times and storage devices with slower access times. The partitions, selected for executing the query, may be implemented on the faster storage devices, while the non-selected partitions may be implemented on the slower storage devices. By excluding the non-selected partitions based on the modified database query, less time and/or resources are expended in executing the modified database query.

One or more embodiments include modifying a database query based on a known configuration of respective datasets stored in various partitions. The database query is modified specifically to exclude datasets stored in one or more partitions. The database query is thus modified to avoid traversing the excluded partitions while executing the modified database query on other partitions. As an example, a database may be divided into two partitions. A first partition may store datasets created on or after Jan. 1, 2010. A second partition may store datasets created prior to Jan. 1, 2010. Based on this known configuration of the two partitions, the system may modify a database query to exclude the datasets created prior to Jan. 1, 2010. When the modified database query is executed, the system may identify the first partition as being relevant to the requested data. The system may identify the second partition as being irrelevant to the requested data. Responsive to identifying only the first partition as the relevant partition, the modified database query is only executed on the first partition. The modified database query is not executed on the second partition.

One or more embodiments described in this Specification and/or recited in the claims may not be included in this General Overview section.

2. Query Modification System Architecture

FIG. 1 illustrates a query modification system 100, in accordance with one or more embodiments. As illustrated in FIG. 1, query modification system 100 includes a query modification engine 102, a data repository 118, and a database 122. In one or more embodiments, system 100 may include more or fewer components than the components illustrated in FIG. 1. The components illustrated in FIG. 1 may be local to or remote from each other. The components illustrated in FIG. 1 may be implemented in software and/or hardware and may be distributed over one or more applications and/or machines. Operations described with respect to one component may instead be performed by another component.

In one or more embodiments, a database query 112 is a request for all or a subset of information from a particular database 122. Database query 112 specifies the particular subset of information to be returned based on one or more criteria. As an example, a database query may request that information corresponding to any datasets that satisfy a particular criterion be returned. As another example, a database query may request that information corresponding to one or more particular data fields of a schema of a database be returned. A criterion included in a database query 112 is also referred to herein as a "search term."

In an embodiment, database query 112 is associated with a time-of-execution 116. Time-of-execution 116 may be a time at which database query 112 was generated for execution, received for execution, and/or transmitted for execution.

In an embodiment, database query 112 is associated with a source 114. Source 114 may be a user, an application, a device, and/or a tenant from which database query 112 originates. A tenant is a corporation, organization, enterprise or other entity that accesses a shared computing resource, which may be implemented in a cloud environment. Further description on cloud environments are included below in Section 8, titled "Cloud Environments." Additionally or alternatively, source 114 may be a function or command within a set of source code from which database query 112 originates. Additionally or alternatively, source 114 may be a data structure from which database query 112 originates.

The following example illustrates various entities, associated with a database query 112, that may be identified as a source of the database query 112. A server may store Sales Databases of multiple tenants including Shoes Corp. Employee John Smith, of Shoes Corp., may submit a database query via a user interface of a Sales Application. John Smith may be identified as a source of the database query. Additionally or alternatively, the Sales Application may be identified as a source of the database query. Additionally or alternatively, Shoes Corp. may be identified as a source of the database query.

Database query 112 may not necessarily specify the source 114 and/or time-of-execution 116 of database query 112. Source 114 of database query 112 may be stored in an application context of database 122 upon which the database query 112 (or modification thereof) is to be executed. An application context includes information about a current session associated with database 122, such as a user identifier (ID), a client ID, a role of the user, and/or other attributes of source 114. The application context may remain unchanged while a session remains active. The application context may be stored in a cache memory of database 122.

In one or more embodiments, a modified database query 120 is a modified version of database query 112. Modified database query 120 may include database query 112 itself and an additional filter for filtering database 122. The filter (and/or other modification) may be determined based on source 114, time-of-execution 116, and/or other characteristics associated with database query 112. Examples of operations for obtaining modified database query 120 are described below at least with reference to FIG. 3.

Information describing modified database query 120 may be implemented across any of components within system 100. However, this information is illustrated within data repository 118 for purposes of clarity and explanation.

Data repository 118 is any type of storage unit and/or device (e.g., a file system, database, collection of tables, or any other storage mechanism) for storing data. Further, data repository 118 may include multiple different storage units and/or devices. The multiple different storage units and/or devices may or may not be of the same type or located at the same physical site. Further, data repository 118 may be implemented or may execute on the same computing system as query modification engine 102 and/or query execution engine 104. Alternatively or additionally, data repository 118 may be implemented or executed on a computing system separate from query modification engine 102 and/or query execution engine 104. Data repository 118 may be communicatively coupled to query modification engine 102 and/or query execution engine 104 via a direct connection or via a network.

In one or more embodiments, a database 122 includes datasets organized according to a schema. The schema includes one or more data fields. Datasets of database 122 may be associated with different characteristics. As an example, a database may include datasets that were generated and/or last accessed within different time periods. A database may include datasets that are accessed with different frequencies. A database may include datasets that are associated with different users, applications, and/or tenants. A database may include datasets that are associated with differing security access. A database may store the datasets across different storage devices of different types.

Database 122 may be divided into one or more partitions 124 based on one or more partitioning keys. A partitioning key is a particular data field of a schema of database 122 that is used to identify a partition for storing each dataset of database 122. Examples of operations for selecting a partition for storing a particular dataset are described below at least with reference to FIG. 2.

In range partitioning, a partitioning key corresponds to different ranges of values, which are mapped to different partitions. As an example, a partitioning key may be a "creation date" data field of a schema of a database. Datasets having a value under the "creation date" data field that is between a particular range (such as the present and Jan. 1, 2015) may be stored in one partition. Datasets having a value under the "creation date" data field that is between another range (such as Dec. 31, 2014, and Jan. 1, 2010) may be stored in another partition.

In list partitioning, a partitioning key corresponds to different lists of values, which are mapped to different partitions. As an example, a partitioning key may be a "State" data field of a schema of a database. One list of values may include California and Oregon. Another list of values may include New York and Massachusetts. Datasets having "California" and/or "Oregon" under the "State" data field may be stored in one partition. Datasets having "New York" and/or "Massachusetts" under the "State" data field may be stored in another partition.

In hash partitioning, a partitioning key corresponds to different hash values, which are mapped to different partitions. A hash value, corresponding to a dataset, is a result of applying a hashing algorithm to the value stored under the data field serving as the partitioning key. Datasets that correspond to a particular hash value may be stored in one partition. Datasets that correspond to a different hash value may be stored in another partition.

Each partition 124 may be managed independently. Different management policies may provide, for example, different storage characteristics and/or security characteristics to different partitions 124. As an example, one partition may be stored on a faster storage device, while another partition may be stored on a slower storage device. As another example, one partition may store data at a higher level of compression, while another partition may store data at a lower level of compression. Alternatively, one partition may store data without compression, while another partition may store data with some level of compression.

As another example, one partition may be stored on a higher data tier of an information lifecycle management (ILM) system, while another partition may be stored on a lower data tier. An ILM system involves the management of information, from the creation of the information to the deletion of the information. A dataset may be important, relevant, and/or valuable to a user and/or application, at the time the dataset is created. The dataset may lose importance, relevancy, and/or value as the dataset becomes older. Alternatively, the dataset may no longer be allowable to the user and/or application as the database becomes older. Datasets with more importance (and/or datasets that are allowable) are stored on a higher data tier, which may be implemented on faster and more expensive storage devices. Datasets with less importance (and/or datasets that are not allowable) are stored on a lower data tier, which may be implemented on slower and less expensive storage devices. Moving datasets from a higher data tier to a lower data tier as the datasets increase in age may be referred to herein as "archiving."

Each partition 124 may have an individual index for looking up the information in the partition 124. An individual index for a particular partition 124 indexes information of the particular partition 124 without indexing information of other partitions 124.

In an embodiment, partitioning of database 122 does not affect the way in which database 122 is accessed. An application accesses a partitioned-database just as the application accesses a non-partitioned database. The application accesses a partitioned-database by referencing a name and/or identifier of the database, without referencing a particular partition of the database.

In one or more embodiments, results 126 include datasets that are returned from the execution of a database query (e.g., modified database query 120). When a database query 112 is executed on a subset of a database 122 (e.g., a particular partition 124), the results 126 include datasets corresponding to that subset of the database 122.

In one or more embodiments, query modification engine 102 refers to hardware and/or software configured to perform operations described herein for modifying database query 112 based on source 114 and/or time-of-execution 116 associated with database query 112. Database query 112 is modified to obtain modified database query 120 prior to execution. Examples of operations for modifying database query 112 are described below at least with reference to FIG. 3.

In one or more embodiments, query execution engine 104 refers to hardware and/or software configured to perform operations described herein for executing database query 112 and/or modified database query 120. In an embodiment, query execution engine 104 may include operations for selecting one or more partitions 124 that are relevant to modified database query 120, prior to executing modified database query 120. Examples of operations for executing database query 112 and/or modified database query 120 are described below at least with reference to FIG. 3.

In an embodiment, query modification engine 102 and/or query execution engine 104 are implemented as parts of a database application (not illustrated). The database application may perform additional functions, such as writing new datasets into database 122, modifying existing datasets in database 122, and removing data sets from database 122.

In an embodiment, query modification engine 102 and/or query execution engine 104 are implemented on one or more digital devices. The term "digital device" generally refers to any hardware device that includes a processor. A digital device may refer to a physical device executing an application or a virtual machine. Examples of digital devices include a computer, a tablet, a laptop, a desktop, a netbook, a server, a web server, a network policy server, a mainframe, a television, a content receiver, a set-top box, a printer, a mobile handset, a smartphone, and/or a personal digital assistant ("PDA").

Figure 2:
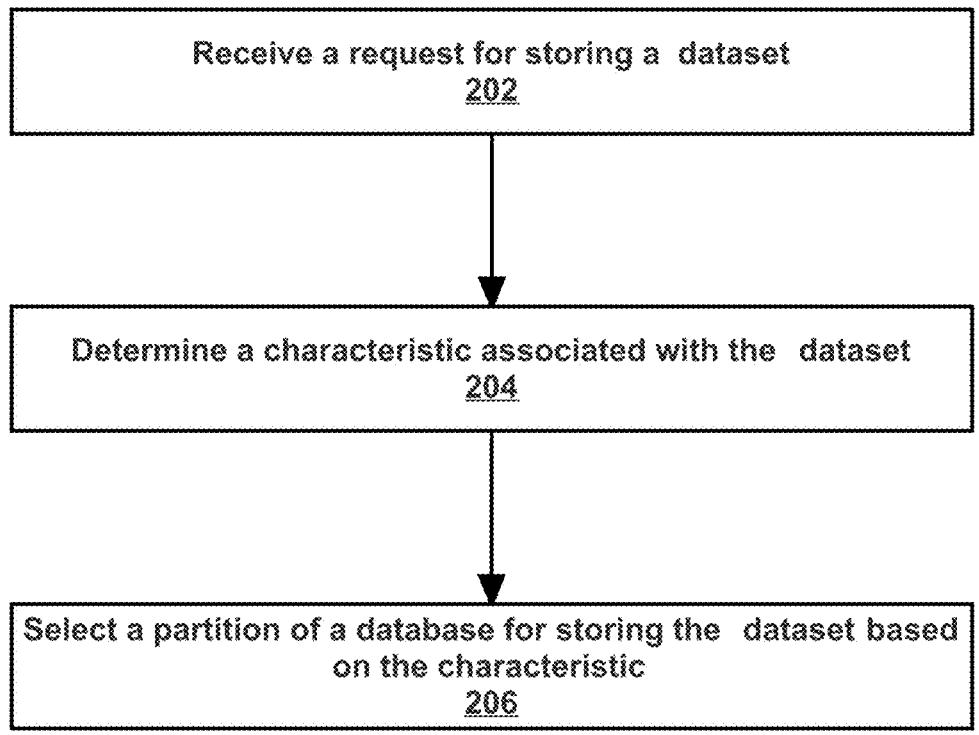
FIG. 2 illustrates an example set of operations for selecting a partition of a database for storing a dataset based on a characteristic of the dataset, in accordance with one or more embodiments.

3. Selecting a Partition of a Database for Storing a Dataset Based on a Characteristic of the Dataset As described above, a database 122 may be divided into one or more partitions 124 based on a partitioning key. A partition 124 for storing a particular dataset is determined using the partitioning key. FIG. 2 illustrates an example set of operations for selecting a partition of a database for storing a dataset based on a characteristic of the dataset, in accordance with one or more embodiments. One or more operations illustrated in FIG. 2 may be modified, rearranged, or omitted all together. Accordingly, the particular sequence of operations illustrated in FIG. 2 should not be construed as limiting the scope of one or more embodiments.

One or more embodiments include receiving a request for storing a dataset (Operation 202). A database application receives the request for storing the dataset in a database 122 via a user interface and/or from another application. The dataset is organized according to a schema of the database 122.

One or more embodiments include determining a characteristic associated with the dataset (Operation 204). The database application identifies values corresponding to one or more data fields of the dataset to be stored in the database 122. The database application determines that the values corresponding to the data fields are a characteristic associated with the dataset. Additionally or alternatively, the database application applies a hashing algorithm to the values corresponding to the data fields. The database application determines that the hash values are a characteristic associated with the dataset.

One or more embodiments include selecting a partition 124 of a database 122 for storing the dataset based on the characteristic (Operation 206). The database application determines a partitioning key associated with the database 122. The database application also determines which values of the partitioning key correspond to which partitions 124 of the database 122. The database application determines that the characteristic of the dataset matches the values of the partitioning key corresponding to a particular partition 124. The database application selects the particular partition 124 for storing the dataset.

As an example, a partitioning key may be a "creation date" data field of a schema of a database. Datasets having a value under the "creation date" data field that is between the present and Jan. 1, 2015, may be stored in a partition on a faster storage device. Datasets having a value under the "creation date" data field that is between Dec. 31, 2014, and Jan. 1, 2010, may be stored in another partition on a slower storage device.

Continuing the example, a value stored under the "creation date" data field of a particular dataset may be "Oct. 5, 2013." A database application may determine that "Oct. 5, 2013" is within the range Dec. 31, 2014 to Jan. 1, 2010, which corresponds to the partition on the slower storage device. The database application would select the partition on the slower storage device for storing the particular dataset.

If a partition 124 for storing the dataset does not already exist, the database application may form the partition 124. The database application may define storage characteristics and/or security characteristics for the partition 124. The database application may generate an index for the partition 124 that is separate from the index for the database 122 and/or the indexes for other partitions 124. After forming the partition 124, the database application stores the dataset into the partition 124.

Storing datasets onto different partitions 124 based on characteristics associated with the datasets may reduce the resources and/or time needed for subsequent retrieval of the datasets. A database query 112 for datasets that are stored on a single partition 124 is executed on that single partition 124. Since other partitions 124 are not traversed, the resources and/or time needed to execute the database query 112 is reduced.

In an embodiment, a partitioning key is defined such that information of different levels of importance, relevancy, and/or value to a particular source 114 is stored on different partitions. More important information is stored on one partition. Less important information is stored on another partition. Additionally or alternatively, information that is accessible to a user and/or application, under a security policy, is stored on one partition. Information that is not accessible is stored on one or more other partitions.

As an example, salespersons in a California regional office may focus on customers located in California. Datasets of customers located in California may be more important, than datasets of other customers, to the salespersons in the California regional office. A partitioning key of a database may be a "State" data field, indicating the state in which each customer is located. Datasets with a value "California" under the "State" data field may be stored in one partition. Other datasets may be stored in other partitions. Subsequently, salespersons in the California regional office may submit database queries to the database. The database queries may request datasets of California customers but not datasets of customers of other states. The database queries may be executed on the single partition storing the datasets of "California" customers, rather than the entire database.

In an embodiment, an ILM system may be implemented on a database 122 having multiple partitions 124. Partitions 124 storing more important information is implemented on a type of storage device that provides faster access times. Partitions 124 storing less important information is implemented on a type of storage device that provides slower access times. Hence, database queries 112 requesting more important information are executed more quickly on the faster storage device. Meanwhile, less important information is maintained in slower, less expensive storage.

Figure 3:
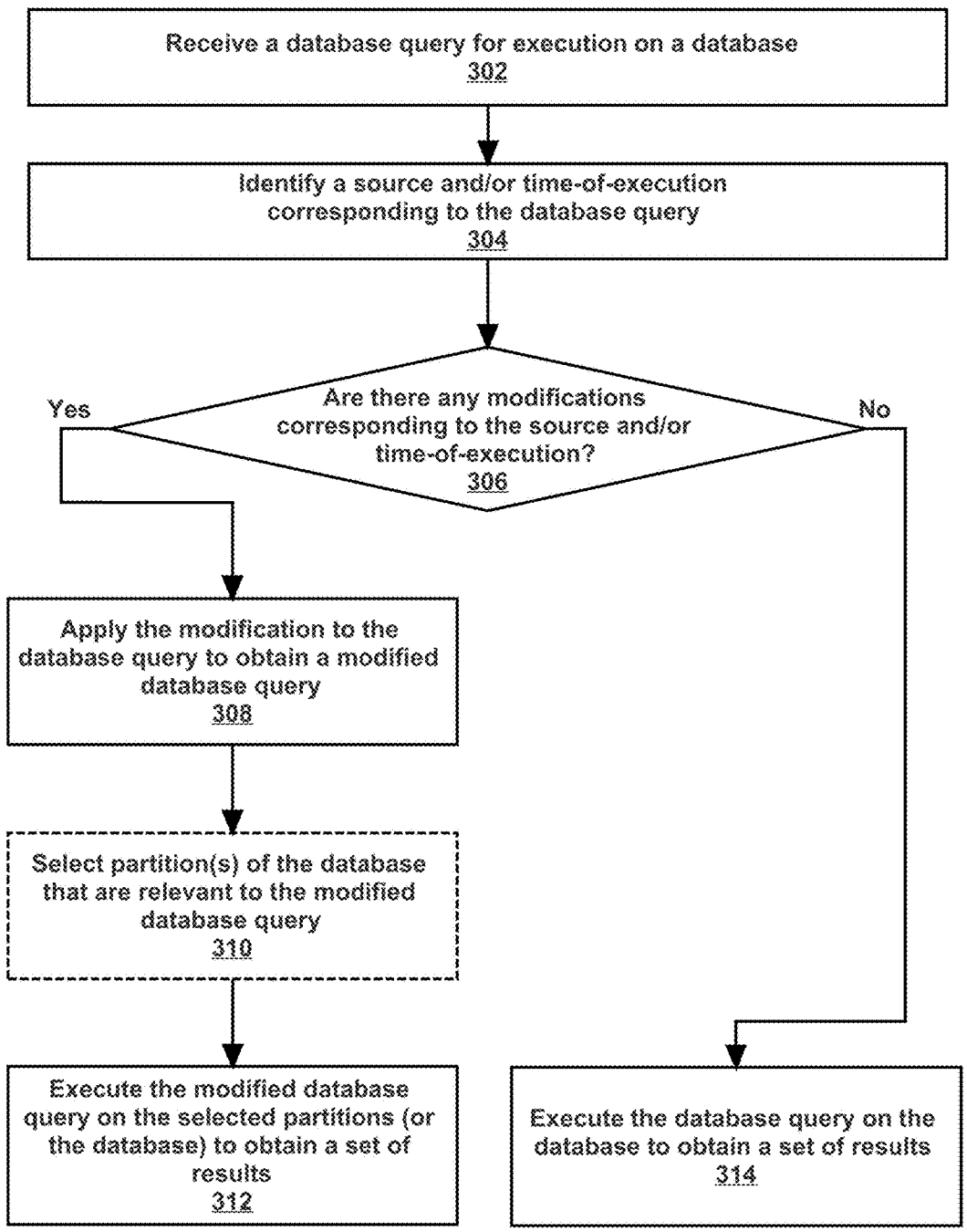
FIG. 3 illustrates an example set of operations for modifying a database query based on a source and/or time corresponding to the database query, in accordance with one or more embodiments.

4. Modifying a Database Query Based on a Source and/or Time-of-Execution Corresponding to the Database Query As described above, a database query is modified prior to being executed. FIG. 3 illustrates an example set of operations for modifying a database query based on a source and/or time corresponding to the database query, in accordance with one or more embodiments. One or more operations illustrated in FIG. 3 may be modified, rearranged, or omitted all together. Accordingly, the particular sequence of operations illustrated in FIG. 3 should not be construed as limiting the scope of one or more embodiments.

One or more embodiments include receiving a database query 112 for execution on a database 122 (Operation 302). A query modification engine 102 receives the database query 112 via a user interface and/or from another application. The database query 112 includes one or more criteria. A criterion specifies a range of values (or a list of values) corresponding to a particular data field used in the database 122. Based on the criterion, datasets having a value under the particular data field that is within the specified range (or the specified list) are returned to the database query 112.

In an embodiment, a user interface accepts user input specifying the database query 112. The user interface includes functionality to accept user input specifying values of a particular data field as a criterion of the database query 112. The user interface does not include functionality to accept user input specifying values of another data field as a criterion of the database query 112. Alternatively, an application generates the database query 112. The application includes functionality to generate a criterion based on a particular data field. The application does not include functionality to generate a criterion based on another data field.

However, as described below, the query modification engine 102 may modify the database query 112 to filter the database 122 based on one or more data fields not included in the filtering functionality of the user interface and/or application. Hence, even though the user interface and/or application does not have the functionality to filter the database 122 based on a particular criterion, the query modification engine 102 may modify the database query 112 to filter the database 122 based on the particular criterion. The query modification engine 102 may make a modification based on any data field in the database 122. The modification is performed without a need to make direct changes to the user interface and/or application.

One or more embodiments include identifying a source 114 and/or time-of-execution 116 corresponding to the database query 112 (Operation 304). The database query 112 may not necessarily specify the source 114 and/or time-of-execution 116 of the database query 112.

The query modification engine 102 retrieves information identifying the source 114 from a cache, or other data repository, associated with the database 122. The information identifying the source 114 may be stored in an application context. The information identifying the source 114 was recorded at the time a current session associated with the source 114 was established and/or initiated. The information identifying the source may remain unchanged during the current session. The information identifying the source 114 may include a user logged into the database 122, a tenant associated with a user logged into the database 122, a device used to access the database 122, and/or an application used to access the database 122.

The query modification engine 102 identifies the time-of-execution 116 from a clock associated with the query modification engine 102 and/or a clock associated with the database 122. The query modification engine 102 determines a time-of-execution 116 at which the database query 112 was received and/or generated for execution.

One or more embodiments include determining whether there are any modifications corresponding to the source 114 and/or time-of-execution 116 of the database query 112 (Operation 306). The query modification engine 102 retrieves a set of rules from a data repository. The set of rules may be stored in various formats, such as a table, a linked list, an array, a function, and/or a set of logic statements or parameters. The set of rules specifies different modifications corresponding to different sources 114 and/or times-of-execution 116. The set of rules may explicitly or implicitly specify that no modifications correspond to a particular source 114 and/or time-of-execution 116.

A system and/or a user may have previously determined the set of rules that the query modification engine 102 retrieves from the data repository. The set of rules were determined based on a known configuration of respective datasets stored in various partitions. The datasets were stored in various partitions according to a partitioning key, as described above with reference to FIG. 2. The set of rules were determined so that a database query 112 modified based on the set of rules would exclude datasets that are not allowed, less important, less relevant, and/or less valuable. Additionally or alternatively, the set of rules were determined so that a database query 112 modified based on the set of rules would exclude datasets that are stored on one or more partitions 124 of the database 122.

The query modification engine 102 inputs the source 114 and/or time-of-execution 116 identified at Operation 304 as a parameter into the set of rules retrieved from the data repository. Based on the source 114 and/or time-of-execution 116, the query modification engine 102 determines a modification to be applied to the database query 112. The modification may add a filter to the database query 112. The filter specifies a predicate, which must be true for a particular dataset in order for the particular dataset to be returned as a result of the database query 112. The filter excludes datasets for which the predicate is false.

The query modification engine 102 may generate a filter directly based on the source 114 and/or time-of-execution 116 identified at Operation 304. The filter uses the source 114 and/or time-of-execution 116 in specifying the predicate. As an example, a schema for a database may include a data field for "User ID." A source of a database query may be a user with an identifier (ID) #1234. A query modification engine may generate a filter directly based on the User ID. A filter may include a predicate that requires results to have the value "#1234" under the "User ID" data field.

Additionally or alternatively, the query modification engine 102 may generate a filter that does not directly reference the source 114 and/or time-of-execution 116. The predicate of the filter does not include a reference to the source 114 and/or time-of-execution 116. As an example, a database may be used for maintaining sales records of various geographical regions. A schema for the database may include a data field for "Region." A source of a database query may be a user with an ID #1234. The user may be a sales representative of the "North America" region. A query modification engine may map User ID #1234 to the "North America" region. The query modification engine may generate a filter based on the "Region" data field. A filter may include a predicate that requires results to have the value "North America" under the "Region" data field.

The filter may exclude datasets that are not associated with the source 114. As an example, a source may be an employee of a Human Resources (HR) Department. A filter determined based on the source may include HR-related datasets. The filter may exclude datasets of other departments. As another example, a source may be a particular application. A filter determined based on the source may include datasets generated by the particular application, but exclude datasets generated by other applications.

Additionally or alternatively, the filter may exclude datasets that are not generated, modified, and/or accessed within a particular time period that is associated with the source 114. As an example, a database may be used for maintaining sales records. The database may include current sales records (such as, sales within the past year), intermediate sales records (such as, sales between one and two years ago), and archive sales records (such as sales from three or more years ago). A source of a database query may be an employee in the Sales Department. A filter determined based on the department of the employee may include current sales records. The filter may exclude intermediate and archive sales records. Another source may be an employee of the Support Team. Employees of the Support Team may need access to both current sales records and intermediate sales records to assist customers who have made a purchase within the last two years. A filter determined based on the department of the employee may include current and intermediate sales records. Another source may be an employee of the Management Team (such as a Chief Executive Officer). A filter determined based on the department of the employee may include all sales records (current, intermediate, and archive sales records).

As another example, a source may be a particular employee who was on leave from Jan. 1, 2015 to Jul. 1, 2015. A filter determined based on the particular employee may exclude datasets from the time period Jan. 1, 2015, to Jul. 1, 2015.

Additionally or alternatively, the filter may exclude datasets that are not generated, modified, and/or accessed within a particular time period, which is specified with reference to the time-of-execution 116 corresponding to the database query 112.

As an example, a set of rules may specify that a filter to be added to a database query should exclude datasets not having a value under a "Creation Date" data field within the last five years. The set of rules may specify the following function:

Creation_Date>(query_time—5 years), wherein Creation_Date represents values under the "Creation Date" data field, and query_time represents the time at which the database query was received.

Continuing the example, a particular database query may be received on Feb. 1, 2016. A query modification engine may determine a modification for the particular database query based on the time at which the particular database query was received. The time Feb. 1, 2016, may be input as a parameter into the function. The output of the function would be the criterion:

Creation_Date>Feb. 1, 2011.

Continuing the example, a query modification engine may modify a database query based on a time-of-execution of the database query by adding a filter with the above output serving as predicate of the filter.

In an embodiment, the query modification engine 102 determines a security level associated with the database query 112 based on the source 114 of the database query 112. The query modification determines the security level from a user profile of the source 114, which is stored in a data repository. The query modification engine 102 inputs the security level associated with the database query 112 as a parameter into a set of rules. Based on the security level, the query modification engine 102 determines a modification corresponding to the database query 112.

If there is no modification corresponding to the source 114 and/or time-of-execution 116, then a query execution engine 104 executes the database query 112 on the database 122 to obtain a set of results 126 (Operation 314). The query execution engine 104 looks up an index, if one exists, corresponding to the database 122. The query execution engine 104 retrieves datasets matching the criteria of the database query 112. The datasets may be retrieved from any partition 124 of the database 122.

However, if there is a modification corresponding to the source 114 and/or time-of-execution 116, then the query modification engine 102 applies the modification to the database query 112 to obtain a modified database query 120 (Operation 308). The query modification engine 102 adds a filter, specified by the modification, to the database query 112. If the database query 112 received at Operation 302 already included a filter, then the modification adds an additional filter to the existing filter of the database query 112. Hence, both the existing filter in the database query 112 and the filter that is added as a result of the modification are included in the modified database query 120.

The filter added to the database query 112 may be based on a data field that serves as a partitioning key of the database 122. By adding the filter, results to the modified database query 120 would be restricted to one or more partitions 124 of the database 122. The results to the modified database query 120 would not be found in one or more other partitions 124 of the database 122.

As an example, a partitioning key may be a "Product" data field. Datasets with a value "Laptop" under the "Product" data field are stored in a first partition. Datasets with a value "Desktop" under the "Product" data field are stored in a second partition. A query modification engine may modify a database query by adding a filter. The filter may exclude datasets that do not have the value "Laptop" under the "Product" data field. Based on the added filter, results to the modified database query would be within the first partition and not the second partition.

The filter added to the database query 112 may be based on a data field that was not initially included in the database query 112. As an example, an initial database query may request all datasets from a database T. A query modification engine may determine that a modification for the initial database query is the addition of a filter. The filter may exclude datasets that do not have the value "California" under the "State" data field. While the initial database query did not include a criterion based on the "State" data field, the modified database query would include a criterion based on the "State" data field.

The database query 112 might not include a particular criterion because the user interface that received the database query 112 did not have the functionality to accept user input specifying the particular criterion. Additionally or alternatively, the database query 112 might not include a particular criterion because the application that generated the database query 112 did not have the functionality to specify the particular criterion. However, the query modification engine 102 may add the particular criterion as a filter to the database query 112.

As an example, a database may include the data fields "Last Access Date" and "User on Last Access." A user interface may be configured to accept user input specifying a database query. The user interface may include an interface element for accepting user input specifying a value for the "Last Access Date" data field as a search term. The user interface might not include an interface element for accepting user input specifying a value for the "User on Last Access" data field as another search term.

A user may specify a database query via the user interface. The user may specify that the "Last Access Date" must be within the past seven days. A query modification engine may modify the database query to additionally filter the database based on the "User on Last Access" data field. The additional filter may specify that the "User on Last Access" must be the current user. Hence, a set of results, for the modified database query, would include datasets that have both (a) a "Last Access Date" within the past seven days, and (b) a "User on Last Access" that is the same as the current user.

The modification to the database query 112 may be made in any programming language. In Structured Query Language (SQL), for example, a database query includes one or more WHERE clauses to filter a database. A WHERE clause is followed by a predicate, which is one or more criteria for filtering the database. A criterion specifies a range of values (or a list of values) corresponding to a particular data field used in the database 122. Based on the criterion, results that are returned must include a value under the particular data field that is within the specified range (or the specified list). A query modification engine 102 may modify a database query by adding a WHERE clause to the database query.

One or more embodiments optionally include selecting partition(s) 124 of the database 122 that are relevant to the modified database query 120 (Operation 310). A query execution engine 104 determines a partitioning key associated with the database 122. The query execution engine 104 determines whether any criteria (such as a search term and/or predicate) included in the modified database query 120 is based on a data field that serves as the partitioning key of the database 122.

If no criteria included in the modified database query 120 is based on the partitioning key, then the query execution engine 104 selects all partitions 124 of the database 122 as partitions 124 that are relevant to the modified database query 120. As an example, a partitioning key may be a "Creation Date" data field. A modified database query may request datasets with the value "Washington D.C." under a "State" data field. The criterion included in the database query would be based on the "State" data field, which is not a partitioning key. Hence, a query execution engine would select all partitions as being relevant to the modified database query.

If a criterion included in the modified database query 120 is based on the partitioning key, then the query execution engine 104 determines a range of values (or a list of values), corresponding to the partitioning key, that are mapped to a particular partition 124 of the database 122.

As an example, a partitioning key may be a "Creation Date" data field. A query execution engine may determine that a range of values [Jan. 1, 2000-Dec. 31, 2004], under the "Creation Date" data field, is mapped to a first partition. The query execution engine may determine that another range of values [Jan. 1, 2005-Dec. 31, 2009], under the "Creation Date" data field, is mapped to a second partition.

As another example, a partitioning key may be a "State" data field. A query execution engine may determine that a list of values ["California"; "Oregon"], under the "State" data field, is mapped to a first partition. The query execution engine may determine that another list of values ["Washington D.C."; "Virginia"], under the "State" data field, is mapped to a second partition.

In addition, the query execution engine 104 determines a range of values (or a list of values), corresponding to the partitioning key, specified by a criterion included in the modified database query 120.

As an example, a criterion included in a modified database query may require results that are returned to have a value under the "Date" data field that is between Jan. 1, 2000 and Dec. 31, 2003. In this example, a range of values specified by the criterion would be [Jan. 1, 2000-Dec. 31, 2003].

As another example, a criterion included in a modified database query may require results that are returned to have a value under the "State" data field that is one of "California" or "Washington." In this example, a list of values specified by the criterion would be ["California"; "Washington"]. This criterion may be additional to any number of other criteria that is applied to a set of results.

The query execution engine 104 determines whether there is any overlap between (a) the range of values, corresponding to the partitioning key, that maps to the particular partition 124 and (b) the range of values, corresponding to the partitioning key, specified by the criterion included in the modified database query 120. If there is an overlap, then the query execution engine 104 selects the particular partition 124 as being relevant to modified database query 120. If there is no overlap, then the query execution engine 104 determines that the particular partition 124 is not relevant to the modified database query 120.

As an example, a partitioning key may be a "Creation Date" data field. A query execution engine may determine that the range [Jan. 1, 2000-Dec. 31, 2004], under the "Creation Date" data field, corresponds to a particular partition.

Continuing the example, a criterion included in a modified database query may require results that are returned to have a value under the "Creation Date" data field that is between Jan. 1, 2000 and Dec. 31, 2003. The query execution engine may determine that a range of values specified by the criterion is [Jan. 1, 2000-Dec. 31, 2003].

Continuing the example, the query execution engine determines whether there is an overlap between [Jan. 1, 2000-Dec. 31, 2004] and [Jan. 1, 2000-Dec. 31, 2003]. Since there is an overlap, the query execution engine may determine that the particular partition is relevant to the modified database query.

The query execution engine 104 may repeat the process for multiple partitions 124 of the database 122 to select one or more partitions 124 as partitions 124 that are relevant to modified database query 120.

As described above with reference to FIG. 2, an ILM system may be implemented on a database 122 having multiple partitions 124. Some partitions 124, corresponding to a higher tier within the ILM system, are implemented on faster storage devices. Other partitions 124, corresponding to a lower tier, are implemented on slower storage devices. A modified database query 120 may be determined such that the relevant partitions 124 are restricted to partitions 124 of a higher tier within the ILM system. The query execution engine 104 may select the partitions 124 of the higher tier as the partitions 124 that are relevant to the modified database query 120.

In other embodiments, the query execution engine 104 may use additional or alternative methods for selecting the relevant partitions 124. As an example, a modified database query 120 might not include any criteria that is based on a partitioning key of a database. A query execution engine may determine that the range of datasets requested by the modified database query 120 spans all partitions. The query execution engine may select all partitions as being relevant. The query execution engine may execute the modified database query on all partitions. However, the query execution engine would select the datasets, from the partitions, that match the criteria of the modified database query. The query execution engine would return the selected datasets as a set of results.

One or more embodiments include executing the modified database query 120 on the selected partitions 124 to obtain a set of results 126, without executing the modified database query 120 on the non-selected partitions 124 (Operation 312). The query execution engine 104 returns a set of results 126 that includes datasets stored in the selected partitions 124 and excludes datasets stored in the non-selected partitions 124. Datasets that would have matched the initial database query 112 received at Operation 302 but are stored in the non-selected partitions 124 are excluded.

In an embodiment, the partitions 124 of the database 122 may be associated with individual indexes. If an index exists, the query execution engine 104 traverses an index corresponding to the selected partitions 124. The query execution engine 104 does not traverse an index corresponding to the non-selected partitions 124.

In an embodiment, the selected partitions 124 correspond to faster storage devices, while the non-selected partitions 124 correspond to slower storage devices. The query execution engine 104 may execute the modified database query 120 by traversing the faster storage devices, without traversing the other partitions that may be located on slower storage devices.

In an embodiment, as described above, Operation 310 is optional. The query execution engine 104 might not perform the operation of selecting relevant partitions 124. If the query execution engine 104 does not select relevant partitions 124, then the query execution engine 104 executes the modified database query 120 on the database 122 to obtain a set of results 126. The query execution engine 104 traverses all partitions 124 of the database 122. After traversal of all partitions 124, the query execution engine 104 returns a set of results that match the modified database query 120.

The execution of the modified database query 120, rather than the database query 112 that was received at Operation 302, may be transparent to a user. The query execution engine 104 executes the modified database query 120 without receiving user input specifying the modified database query 120. The query execution engine 104 may present the set of results 126, corresponding to the modified database query 120, without notifying a user that a modification was made to the initial database query 112. The query execution engine 104 may present the set of results 126, corresponding to the modified database query 120, without notifying a user that not all of the partitions 124 of the database 122 were traversed.

Modification of database queries 112 based on a source 114 and/or time-of-execution 116 of the database queries 112 may be performed for various purposes and/or applications. Modification of database queries 112 may be used to restrict results of queries to certain partitions 124 within an ILM system. Additional examples of purposes and/or applications, as described below, include: testing program functionality and/or performance of a database 122 prior to purging and/or archiving a dataset; distributing categories of datasets to particular nodes of a target system; testing an application on a reduced portion of a production database; and enforcing security policies.

Figure 4:
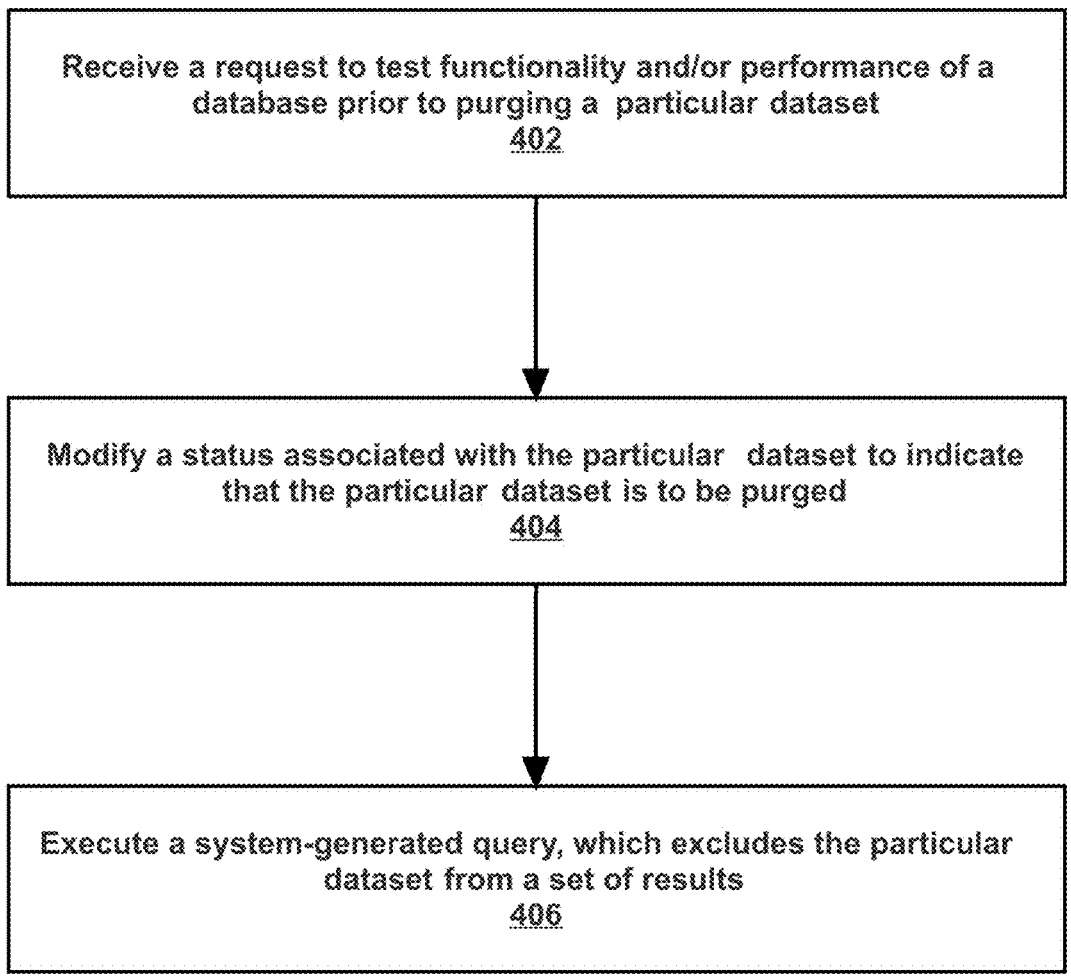
FIG. 4 illustrates an example set of operations for modifying a database query to test functionality and/or performance of a database prior to purging a dataset, in accordance with one or more embodiments.

5. Modifying a Database Query to Test Functionality and/or Performance of a Database Prior to Purging a Dataset As described above with reference to FIG. 3, modification of database queries 112 may be performed to test program functionality and/or performance of a database 122 prior to purging a dataset. FIG. 4 illustrates an example set of operations for modifying a database query to test program functionality and/or performance of a database prior to purging a dataset, in accordance with one or more embodiments. One or more operations illustrated in FIG. 4 may be modified, rearranged, or omitted all together. Accordingly, the particular sequence of operations illustrated in FIG. 4 should not be construed as limiting the scope of one or more embodiments.

One or more embodiments include receiving a request to test program functionality and/or performance of a database 122 prior to purging a particular dataset (Operation 402). A database application receives the request via a user interface and/or from another application. The request may specify that datasets matching a particular criterion are to be purged.

Additionally or alternatively, the request may specify that datasets matching a particular criterion are to be excluded from the results 126 to future modified database queries 120. The database application determines that the particular dataset matches the particular criterion.

The database 122 is organized using a schema that includes a "Status" data field. The "Status" data field may be populated by a value that indicates the status of the dataset, such as "Active" or "Inactive." The particular dataset has a value "Active" under the "Status" data field.

Optionally, the database 122 may be divided into partitions 124. The "Status" data field may serve as a partitioning key. Datasets with the value "Active" under the "Status" data field are stored in one partition 124. Datasets with the value "Inactive" under the "Status" data field are stored in another partition 124.

The particular dataset to be purged may initially be stored in the partition 124 for storing "Active" datasets. The partition 124 for storing "Active" datasets is a partition 124 on which modified database queries 120 (also referred to as "system-generated queries") are executed. The query modification engine 102 modifies database queries 112, as described below at Operation 406, such that the partition for storing "Active" datasets is relevant for executing modified database queries 120. For database queries 112 that were received prior to the request to test functionality and/or performance of the database 112, the set of results 126 (to modified database queries 120 generated based on the database queries 112) may include the particular dataset stored in the partition 124 for "Active" datasets.

One or more embodiments include modifying the status associated with the particular dataset to indicate that the particular dataset is to be purged (Operation 404). The database application modifies the particular dataset such that the "Status" data field holds the value "Inactive."

Optionally, if the database 122 is partitioned based on the "Status" data field, then the database application transfers the particular dataset from the partition 124 for storing "Active" datasets to a partition 124 for storing "Inactive" datasets. The partition 124 for storing "Inactive" datasets is a partition 124 that is not selected for executing system-generated queries. The database application deletes the particular dataset from the partition 124 for storing "Active" datasets.

The partition 124 for storing "Active" datasets (which is the selected partition 124) may be implemented on a faster storage device. The partition 124 for storing "Inactive" datasets (which is the non-selected partition 124) may be implemented on a slower storage device. Additionally or alternatively, the partition 124 for storing "Active" datasets may be implemented on a primary storage device. The partition 124 for storing "Inactive" datasets may be implemented on a secondary (or tertiary) storage device.

One or more embodiments include executing a system-generated query, which excludes the particular dataset from a set of results 126 (Operation 406). A query modification engine 102 receives a database query 112, as described above with reference to Operation 302 of FIG. 3. The query modification engine 102 adds a filter to the database query 112. The filter excludes datasets that do not include the value "Active" under the "Status" data field.

Optionally, a query execution engine 104 selects partitions 124 that are relevant to the modified database query 120. The selected partitions 124 include the partition 124 for storing "Active" datasets. The non-selected partitions 124 include the partition 124 for storing "Inactive" datasets. The query execution engine 104 executes the modified database query 120 on the selected partitions 124, without traversing the non-selected partitions 124. Since the particular dataset to be purged has been transferred to a non-selected partition, the query execution engine 104 returns a set of results that does not include the particular dataset.

Alternatively, the query execution engine 104 does not perform the operation of selecting partitions 124 that are relevant to the modified database query 120. The query execution engine 104 executes the modified database query 120 on the database 122. The query execution engine 104 may traverse all partitions 124 of the database 122. However, since the modified database query 120 excludes "Inactive" datasets, the query execution engine 104 returns a set of results that does not include the particular dataset to be purged.

The functionality and/or performance of the database 112 may be tested for a particular time period, while the particular dataset remains stored in the non-selected partition. During the particular time period, users and/or applications access the database 112 as if the particular dataset were purged. If the functionality and/or performance of the database 112 is satisfactory, then the particular dataset is deleted from the database 122. The particular dataset, which was being stored in the partition 124 for storing "Inactive" datasets, is deleted from all partitions 124 of the database 122. In addition, the query modification engine 102 may cease performance of the operations for modifying database queries 112. The query execution engine 104 may execute database queries 112 without modification.

In contrast, if the user is not satisfied with the program functionality and/or performance of the database, then the dataset is reset to "Active." If the database is partitioned by the "Status" data field, then the database application transfers the particular dataset from the non-selected partition to the selected partition. The query modification engine 102 may cease performance of the operations for modifying database queries 112. The query execution engine 104 may execute database queries 112 without modification. Alternatively, the query modification engine 102 may modify database queries 112 to include both "Active" and "Inactive" datasets. The query execution engine 104 may return a set of results 126 that includes "Active" and "Inactive" datasets. The set of results 126 may include all datasets of the database 122 that match the criteria of an initial database query 112.

Figure 5A:
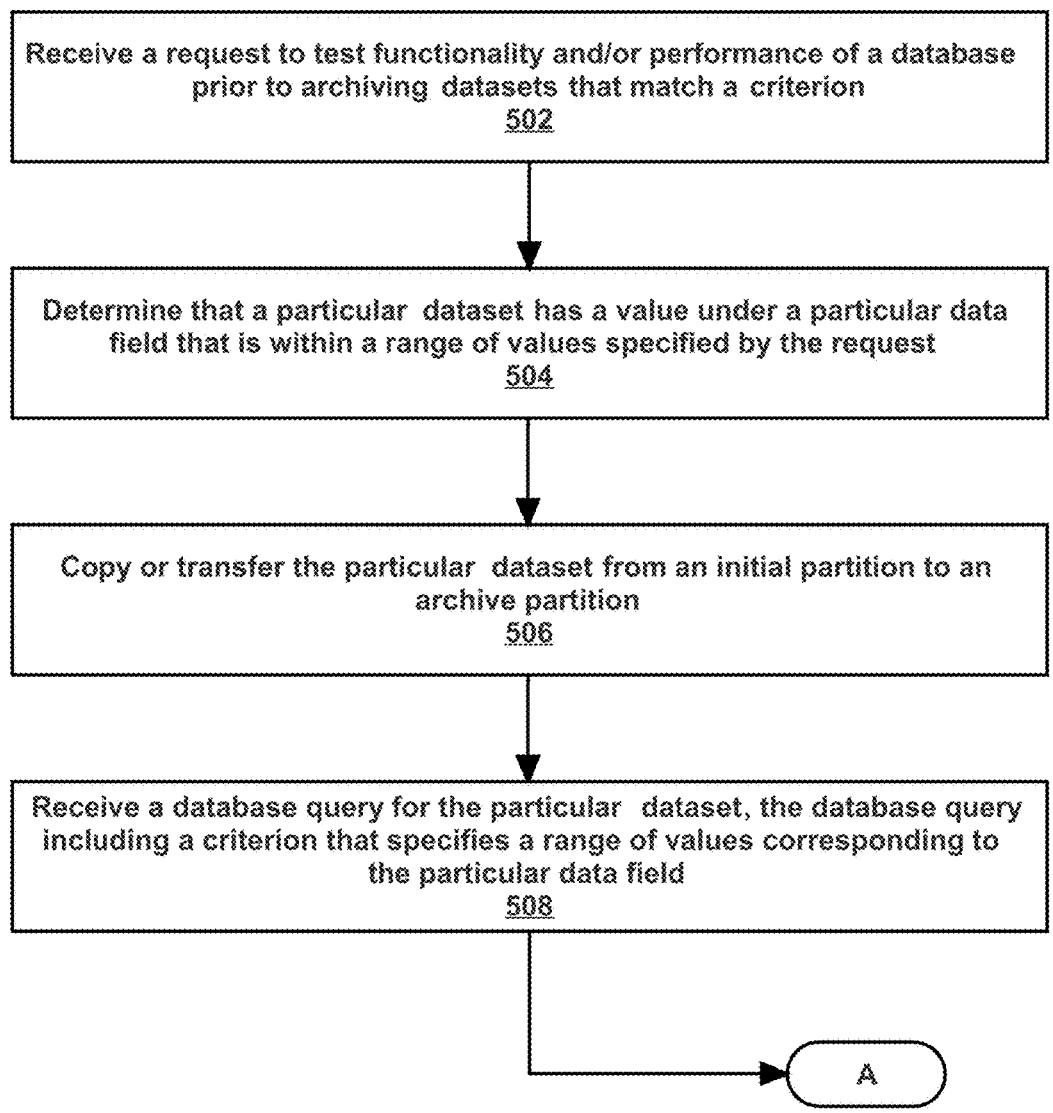
FIGS. 5A and 5B illustrate an example set of operations for modifying a database query to test functionality and/or performance of a database prior to archiving a dataset, in accordance with one or more embodiments.
Figure 5B:
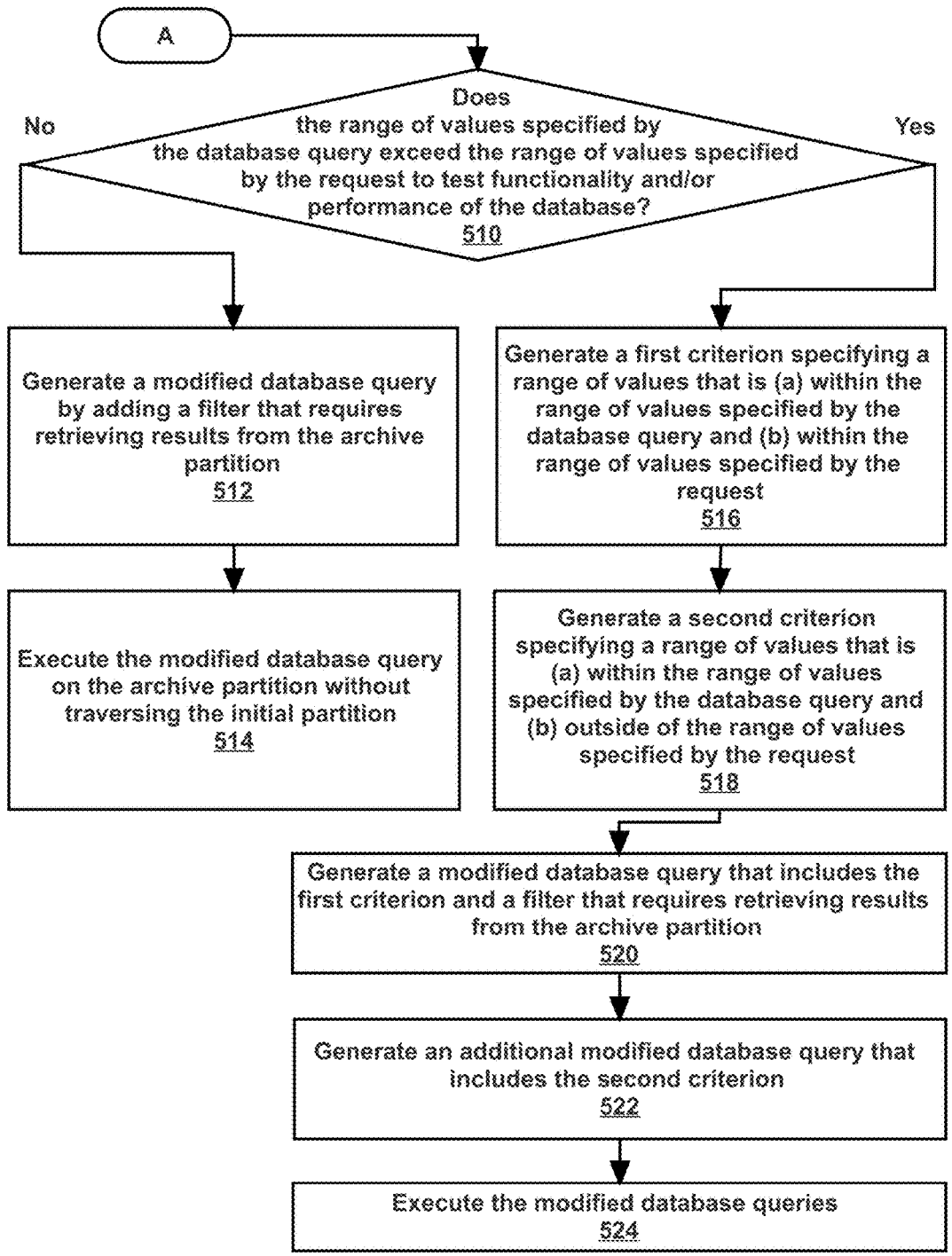

6. Modifying a Database Query to Test Functionality and/or Performance of a Database Prior to Archiving a Dataset As described above with reference to FIG. 3, modification of database queries 112 may be performed to test program functionality and/or performance of a database 122 prior to archiving a dataset. FIGS. 5A and 5B illustrate an example set of operations for modifying a database query to test program functionality and/or performance of a database prior to archiving a dataset, in accordance with one or more embodiments. One or more operations illustrated in FIGS. 5A and 5B may be modified, rearranged, or omitted all together. Accordingly, the particular sequence of operations illustrated in FIGS. 5A and 5B should not be construed as limiting the scope of one or more embodiments.

One or more embodiments include receiving a request to test program functionality and/or performance of a database 122 prior to archiving datasets that match a particular criterion (Operation 502). A database application receives the request via a user interface and/or from another application. The particular criterion specifies a range of values (or a list of values), corresponding to a particular data field used in the database 122. Datasets to be archived are the datasets of the database 122 that match the particular criterion. As an example, an administrator may consider whether to archive datasets that were created between 2005 and 2010. The administrator may submit a request to test functionality of the database prior to archiving those datasets. The request may include a criterion specifying that the value stored under a "Creation Date" data field must be between 2005 and 2010. Based on the criterion, datasets that have a value under the "Creation Date" data field between 2005 and 2010 are the datasets to be archived.

One or more embodiments include determining that a particular dataset has a value under the particular data field that is within the range of values specified by the request (Operation 504). As an example, a request to test functionality and/or performance of a database may specify that datasets with a value under a "Creation Date" data field within a range [2005-2010] are to be archived. A particular dataset may have a value 2006 under the "Creation Date" data field. A database application may determine that the value 2006 is within the range [2005-2010].

One or more embodiments include copying or transferring the particular dataset from an initial partition 124 to an archive partition 124 (Operation 506). The particular dataset may or may not be deleted from the initial partition 124.

The database 122 is organized using a schema that includes a "Status" data field. The "Status" data field may be populated by a value that indicates the status of the dataset, such as "Active" or "Archive." The "Status" data field serves as a partitioning key. Datasets with the value "Active" under the "Status" data field are stored in the initial partition 124. Datasets with the value "Archive" under the "Status" data field are stored in the archive partition 124. The initial partition 124 may be implemented on a faster storage device. The archive partition 124 may be implemented on a slower storage device.

In an embodiment, the database application copies the particular dataset from the initial partition 124 to the archive partition 124. The database application also maintains the particular dataset in the initial partition 124. The particular dataset in the initial partition 124 and the particular dataset in the archive partition 124 are the same, except that the values under the "Status" data field are different. The particular dataset in the initial partition 124 has a value "Active" under the "Status" data field. The particular dataset in the archive partition 124 has a value "Archive" under the "Status" data field. The database application may perform compression on the particular dataset in the archive partition 124.

In another embodiment, the database application transfers the particular dataset from the initial partition 124 to the archive partition 124. The database application does not maintain the particular dataset in the initial partition 124. While transferring the particular dataset, the database application changes the value under the "Status" data field from "Active" to "Archive." The database application may perform compression on the particular dataset in the archive partition 124.

One or more embodiments include receiving a database query 112 for the particular dataset (Operation 508). A query modification engine receives the database query 112 via a user interface and/or from another application, as described above with reference to Operation 302 of FIG. 3. The database query 112 includes a criterion specifying a range of values (or a list of values) corresponding to the particular data field. The particular data field was used, in the request to test functionality and/or performance of the database 122 received at Operation 502, to identify datasets to be archived. The particular dataset has a value under the particular data field that is within the range of values specified by the database query 112.

The database query 112 might not specify the partition from which to retrieve the particular dataset. The database query 112, if executed, may retrieve the particular dataset from the initial partition 124, the archive partition 124, or both.

One or more embodiments include determining whether the range of values specified by the database query 112 exceeds the range of values specified by the request to test functionality and/or performance of the database (Operation 510). The query modification engine 102 identifies the range of values, corresponding to the particular data field, included in the request to test functionality and/or performance of the database 122 received at Operation 502. The range of values was used to identify datasets to be archived.

The query modification engine 102 also identifies the range of values, corresponding to the particular data field, included in the database query 112. The range of values are used to identify datasets to be returned to the database query 112.

The query modification engine 102 compares (a) the range of values specified by the database query 112 and (b) the range of values specified by the request to test functionality and/or performance of the database 122 prior to archiving the dataset. As an example, a request to test functionality of a database specifies that datasets with a value of 2005 under a "Last Accessed Date" data field are to be archived. A user, John, submits a database query to retrieve datasets having a value of 2005 under the "Last Accessed Date" data field. The range of values specified by John's database query (which is, 2005) is within the range of values specified by the request to test functionality of the database (which is, 2005). In contrast, another user, Joe, submits a database query to retrieve datasets having a value between 2005 and 2006 under the "Last Accessed Date" data field. The range of values specified by Joe's database query (which is, 2005-2006) exceeds the range of values specified by the request to test functionality of the database (which is, 2005).

If the range of values specified by the database query 112 does not exceed the range of values specified by the request to test functionality and/or performance of the database, then the query modification engine 102 adds a filter to the database query 112 that requires retrieving the results from the archive partition 124 (Operation 512). The query modification engine 102 adds a filter that excludes datasets that do not have a value of "Archive" under the "Status" data field. The database query 112 with the added filter is a modified database query 120. The modified database query 120 may include one or more filters that were originally included in the initial database query 112 as well as the filter added by the query modification engine 102.

One or more embodiments include executing the modified database query 120 to obtain the particular dataset from the archive partition 124, without traversing the initial partition 124 (Operation 514). A query execution engine 104 selects partitions 124 of the database 122 that are relevant to the modified database query 120, as described above with reference to Operation 310 of FIG. 3. The query execution engine 104 determines that the archive partition 124 is relevant to the modified database query 120. The query execution engine 104 determines that the initial partition 124 is not relevant to the modified database query 120.

The query execution engine 104 executes the modified database query 120 on the selected partitions, without traversing the non-selected partitions, as described above with reference to Operation 312 of FIG. 3. The initial partition 124 is a non-selected partition that is not traversed. Since the initial partition 124 is not traversed, the query execution engine 104 does not retrieve the particular dataset from the initial partition 124. The query execution engine 104 retrieves the particular dataset from the archive partition 124.

As described above with reference to Operation 506, the initial partition 124 may be implemented on a faster storage device. The archive partition 124 may be implemented on a slower storage device. Based on the modified database query 120, the query execution engine 104 retrieves the particular dataset from the slower storage device, rather than the faster storage device. Functionality and/or performance of the database 122 with the particular dataset being retrieved from the archive partition 124, on the slower storage device, is tested.

In contrast, if the range of values specified by the database query 112 exceeds the range of values specified by the request to test functionality and/or performance of the database, then the query modification engine 102 generates a first criterion specifying a range of values that is (a) within the range of values specified by the database query 112 and (b) within the range of values specified by the request (Operation 516). As an example, a range of values, for an "Access Frequency" data field, specified by a database query may be [1000-2999]. In addition, a range of values, for the "Access Frequency" data field, specified by a request to test functionality and/or performance of the database may be [1000-1999]. A range of values that is within both the range of values specified by the database query and the range of values specified by the request would be [1000-1999].

The query modification engine 102 also generates a second criterion specifying a range of values that is (a) within the range of values specified by the database query 112 and (b) outside of the range of values specified by the request (Operation 518). As described in the previous example, a range of values, for an "Access Frequency" data field, specified by a database query may be [1000-2999]. A range of values, for the "Access Frequency" data field, specified by a request to test functionality and/or performance of the database may be [1000-1999]. A range of values that is within the range of values specified by the database query but outside of the range of values specified by the request would be [2000-2999].

One or more embodiments include generating a modified database query 120 that includes the first criterion and a filter that requires retrieving the results from the archive partition 124 (Operation 520). The filter excludes datasets that do not have a value of "Archive" under the "Status" data field. The database query 112 with the first criterion and the added filter is the modified database query 120.

In an embodiment, the modified database query 120 is expressed in SQL. Both the first criterion and the added filter are expressed as WHERE clauses of the modified database query 120. As an example, an initial database query may request datasets having a value under a "Creation Date" data field that is between 2005 and 2010 from a database T. Based on a request to test functionality and/or performance of a database, datasets that have a value under the "Creation Date" data field that is between 2005 and 2008 are to be archived. A criterion for a modified database query may require that a value under the "Creation Date" data field is between 2005 and 2008.

Continuing the example, a query modification engine may determine a filter for a modified database query. The filter may require that a value under a "Status" data field is "Active." The modified database query would then include two WHERE clauses. One WHERE clause would specify that the value under the "Creation Date" data field must be between 2005 and 2008. The other WHERE clause would specify that the value under the "Status" data field must be "Archive."

One or more embodiments include generating an additional modified database query 120 that includes the second criterion (Operation 522). A filter that excludes datasets that do not have a value of "Active" under the "Status" data field may be optionally added. The database query 112 with the second criterion (and, optionally, the added filter) is the additional modified database query 120.

One or more embodiments include executing the modified database queries 120 (Operation 524). One modified database query 120, generated at Operation 520, is restricted to returning datasets having a value that is within the range specified by the request to test functionality and/or performance of the database. The query execution engine 104 executes this modified database query on the archive partition 124. The query execution engine 104 retrieves the particular dataset from the archive partition 124.

Another modified database query 120, generated at Operation 522, is restricted to returning datasets that do not have a value within the range specified by the request to test functionality and/or performance of the database. The query execution engine 104 executes this modified database query on all or a subset of partitions 124 of the database 122.

The query execution engine 104 combines or merges the results from the two modified database queries 120. As an example, the query execution engine 104 may perform a union of the results from the two modified database queries 120. The query execution engine 104 returns the combined results, which includes the particular dataset retrieved from the archive partition 124.

As described above with reference to Operation 506, the initial partition 124 may be implemented on a faster storage device. The archive partition 124 may be implemented on a slower storage device. Based on the modified database queries 120, the query execution engine 104 retrieves the particular dataset from the slower storage device, rather than the faster storage device. Functionality and/or performance of the database 122 with the particular dataset being retrieved from the archive partition 124, on the slower storage device, is tested.

7. Distributing Categories of Datasets to Particular Nodes of a Target System

In an embodiment, a target system may include multiple nodes. Each node may be associated with a cache memory. A database application may include functionality to receive database queries 112 from each of the nodes. When the database application receives a database query 112 from a particular node, the database application determines whether datasets matching the criteria of the database query 112 are stored on the cache memory of the particular node. If so, the database application retrieves the dataset from the cache memory of the particular node rather than from the database 122.

If datasets matching the criteria of the database query 112 are not stored on the cache memory of the particular node, then the database application retrieves the datasets from the database 120. The database application returns the datasets as a set of results 126. In addition, the database application attempts to store the set of results 126 in the cache memory of the particular node. However, if a memory size of the results 126 is larger than the capacity of the cache memory, then the database application stores only a subset of the results 126 on the cache memory. The subset of results 126 that are stored on the cache memory might include information that is less important to a user than the subset of results 126 that are not stored on the cache memory. Hence, a set of results 126 to a modified database query 120 that has a memory size equal to or less than the capacity of the cache memory is desired.

In an embodiment, modification of a database query 112 may be performed to reduce the memory size of a set of results 126. A query modification engine 102 adds a filter to database queries 112 entered by one or more users and/or applications associated with a particular node. The filter is defined to return information that is more important to the users and/or applications of the particular node. The filter excludes information that is less important to the users and/or applications. Hence, the results to a modified database query 120 is a subset of the results to an initial database query 112 received from the users and/or applications.

The cache memory of the particular node might not have sufficient capacity to store the results of the initial database query 112. If the initial database query 112 were executed, the cache memory would store a subset of the results to the initial database query 112. The subset of results, stored on the cache memory, might not be the information that is important to the users and/or applications of the particular node. However, the cache memory may have sufficient capacity to store the results of the modified database query 120. The results of the modified database query 120 include the information that is important to the users and/or applications of the particular node, because the filter added to the database query 120 was defined to return the important subsets of information.

As an example, a user may be a salesperson for laptop products. Datasets associated with laptop products are more important to the user than other datasets. The user may submit an initial database query. The initial database query, if executed, would return a set of results that includes datasets having any value under the "Products" data field. A cache memory would not have sufficient capacity to store the set of results.

Continuing the example, a query modification engine may add a filter to the initial database query. The filter may exclude datasets that do not have the value "Laptop" stored under the "Products" data field. A query execution engine may execute the modified database query with the added filter. The query execution engine may return a set of results that includes datasets having the value "Laptop" stored under the "Products" data field. But the set of results excludes datasets that do not have the value "Laptop" stored under the "Products" data field. Hence, the set of results would include information that is more important to the user than the excluded datasets. The cache memory may have sufficient capacity to store the set of results to the modified database query, which includes the information that is more important to the user.

In an embodiment, modification of a database query 112 may be performed to distribute categories of datasets to particular nodes of a target system. The nodes are associated with different groups of users and/or applications. One group of users and/or applications submit database queries 112 via one node. Another group of users and/or applications submit database queries 112 via another node.

A query modification engine modifies database queries 112 submitted via a particular node by adding a particular filter, associated with the particular node, to the database queries 112. The filter is defined to include a category of datasets that is more relevant to the group of users and/or applications associated with the particular node. Conversely, the filter excludes one or more categories of datasets that are less relevant to the group of users and/or applications associated with the particular node. The query modification engine determines a different filter for each node, based on the category of datasets that is more relevant to that node.

Based on the filters corresponding to each node, datasets of the category associated with each node are distributed to the corresponding node. Hence, the cache memory of each node stores datasets of the category associated with that node.

As an example, data corresponding to the Human Resources (HR) Department may be associated with Node A. Users and/or applications associated with the HR Department may submit database queries through Node A. Meanwhile, data corresponding to the Sales Department may be associated with Node B. Users and/or applications associated with the Sales Department may submit database queries through Node B.

Continuing the example, a query modification engine may add a filter to database queries submitted through Node A. The filter may exclude non-HR related datasets. Hence, results returned to database queries submitted through Node A (i.e., database queries from the users and/or applications associated with the HR Department) include only HR related datasets. Moreover, datasets stored in the cache memory associated with Node A include only HR related datasets.

Continuing the example, the query modification engine may add a different filter to database queries submitted through Node B. The filter may exclude non-Sales related datasets. Hence, results returned to database queries submitted through Node B (i.e., database queries from the users and/or applications associated with the Sales Department) include only Sales related datasets. Moreover, datasets stored in the cache memory associated with Node B include only Sales related datasets.

8. Testing an Application on a Reduced Portion of a Production Database

In an embodiment, modification of database queries 112 may be performed to obtain a staging database that is used for testing of an application. An application to be tested may include functionality to access a production database. However, since the volume of data in the production database may be very large, each call to the production database may require a large amount of time and/or resources. Testing the application on the production database would require a large amount of time and/or resources. In contrast, testing the application on a staging database, which has a smaller storage capacity than the production database, would require a lesser amount of time and/or resources.

The staging database may be a subset of the datasets included in the production database. However, the subset of datasets must be selected such that the staging database maintains referential integrity. That is, each table that includes a key to another table must reference a valid value of the other table.

A production database may include both reference data and transactional data. Reference data includes static data. Transactional data records actions and/or events with reference to the reference data. As an example, Electronics Company may be in the business of selling electronic products. The list of electronic products available for sale may be reference data. The sales records with various customers may be transactional data. One way of generating a staging database with referential integrity is to select all the reference data and a portion of the transactional data. Since all reference data is selected, each reference to the reference data made by the transactional data is valid.

A query modification engine 102 may add a filter to database queries 112 to generate a staging database with referential integrity. The filter may include all reference data of a production database and a portion of transactional data of the production database.

As an example, a production database may be used to track the activities of various users in an electronic filing system. The production database may include reference data, such as a list of files maintained by the electronic filing system. The production database may also include transaction data, such as the activities performed by each user on the files maintained by the electronic filing system. A schema for the production database may include a "Type" data field that indicates whether a dataset comprises reference data or transactional data. Datasets that comprise reference data may have the value "Reference" under the "Type" data field. Datasets that comprise transactional data may have the value "Transactional" under the "Type" data field. A staging database that includes transactional data from the last three years may be desired.

Continuing the example, a filter for generating the staging database may require that datasets that:

(1) have the value "Reference" under the "Type" data field; or (2) have the value "Transactional" under the "Type" data field and have a value under the "Transaction Date" data field that is within the last three years.

During testing, a query modification engine 102 adds the above filter to database queries 112 submitted by a user and/or application. A query execution engine 104 executes the modified database queries 120. The query execution engine 104 returns only a subset of datasets from the production database that satisfies the criteria of the added filter. Since the filter includes all reference data, referential integrity is maintained. Modification of database queries 112 in the testing of an application reduces the resources and/or time necessary for performing the testing.

9. Enforcing a Security Policy

In an embodiment, modification of database queries 112 is performed to enforce a security policy associated with the database 122. A source 114 that submits a database query 112 may have authorization to access only a subset of information in a database 122. A query modification engine 102 adds a filter to the database query 112 to exclude unauthorized information. A query execution engine 104 executes the modified database query 120 with the added filter. The set of results 126 to the modified database query 120 would not include unauthorized information.

10. Example Embodiment: Modifying a Database Query for an Information Lifecycle Management System A detailed example is described below for purposes of clarity. Components and/or operations described below should be understood as one specific example which may not be applicable to certain embodiments. Accordingly, components and/or operations described below should not be construed as limiting the scope of any of the claims.

Figure 6A:
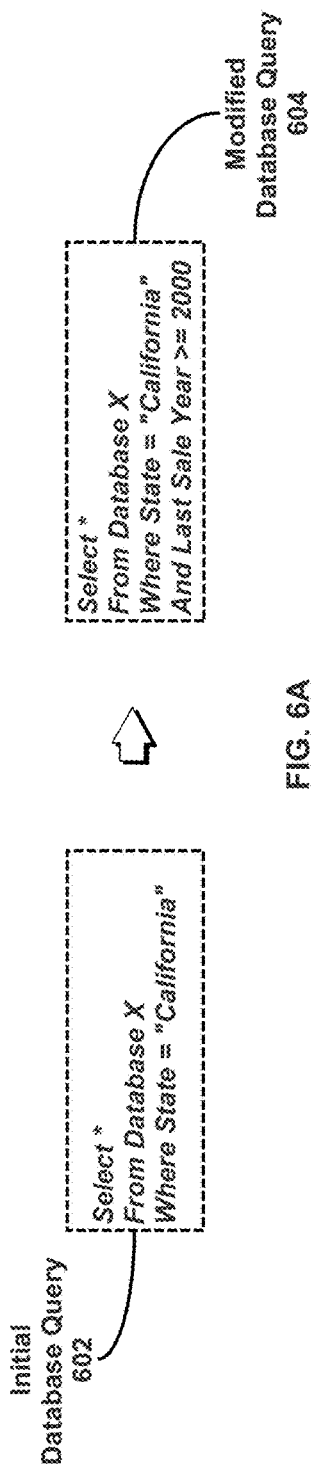
FIGS. 6A and 6B illustrate an example for modifying a database query to exclude data on a slower data storage in an information lifecycle management (ILM) system, in accordance with one or more embodiments.
Figure 6B:
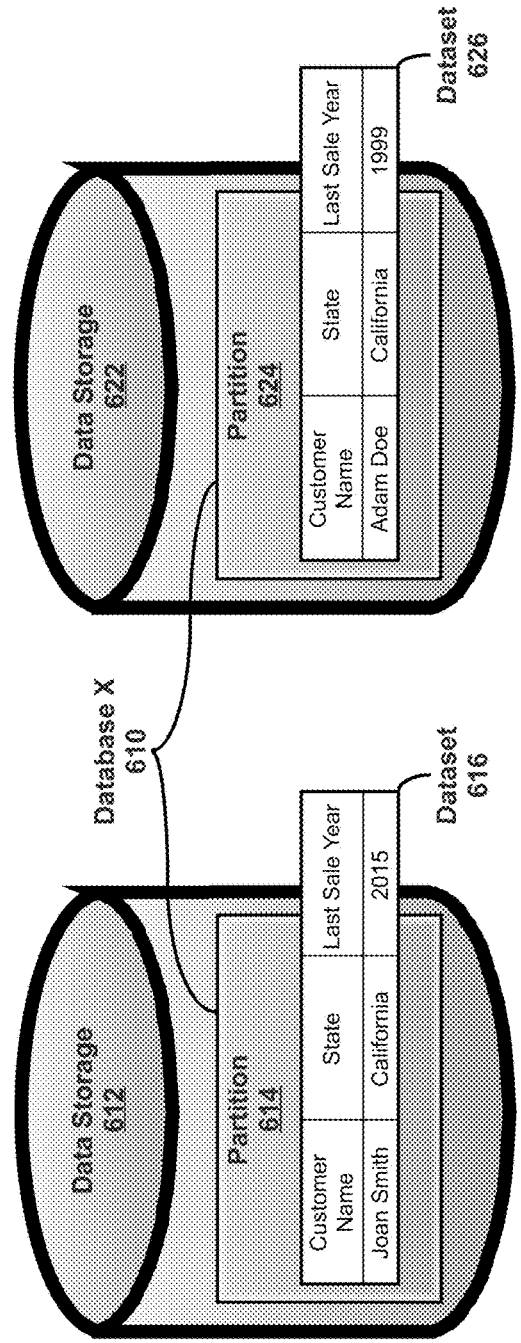

FIGS. 6A and 6B illustrate an example for modifying a database query to exclude data on a slower data storage in an information lifecycle management (ILM) system, in accordance with one or more embodiments.

Under an ILM system, Database X 610 is divided into partition 614 and partition 624. Partition 614 stores newer data. Partition 624 archives older data. The ILM system is implemented using a "Last Sale Year" data field as a partitioning key. Datasets with a value under the "Last Sale Year" data field that is equal to or greater than 2000 is stored in partition 614. In contrast, datasets with a value under the "Last Sale Year" data field that is less than 2000 is stored in partition 624. As illustrated, for example, dataset 616 has a value "2015" under the "Last Sale Year" data field. Dataset 616 is stored in partition 614. Dataset 626 has a value "1999" under the "Last Sale Year" data field. Dataset 626 is stored in partition 624.

Partition 614 and partition 624 are implemented on separate storage devices. Partition 614 is implemented on data storage 612, which is a faster, more expensive storage device. Partition 624 is implemented on data storage 622, which is a slower, less expensive storage device.

A user, Joe, submits an initial database query 602 via a user interface. A query modification engine receives the initial database query 602. The initial database query 602 requests datasets that have a value "California" under the "State" data field from Database X 610. As illustrated, the criterion requiring the value "California" under the "State" data field is expressed in a WHERE clause. Both dataset 616 and dataset 626 have a value "California" under the "State" data field. The initial database query 602, if executed without modification, would return both dataset 616 and dataset 626, hence allowing access to all of the database 122.

The query modification engine determines whether there is a modification corresponding to the user Joe. Different modifications may correspond to different users. The query modification engine maps Joe to a particular modification stored in a data repository. The particular modification adds a filter to the initial database query 602. The filter uses the "Last Sale Year" data field to restrict results to be datasets stored on partition 614 of data storage 612. The filter excludes datasets that do not have a value under the "Last Sale Year" data field that is equal to or greater than 2000.

The particular modification was previously defined based on (a) knowledge about which datasets of Database X 610 are more relevant to Joe, and (b) which datasets of Database X 610 are stored on partition 614 of data storage 612. Newer datasets, with a "Last Sale Year" in or after 2000, are more relevant to Joe. Older datasets, with a "Last Sale Year" before 2000, is less relevant to Joe. Further, a partitioning key of Database X 610 is the "Last Sale Year" data field. Datasets with a "Last Sale Year" in or after 2000 are stored in partition 614. Datasets with a "Last Sale Year" before 2000 are stored in partition 624. The particular modification was previously defined to include a filter based on the "Last Sale Year" data field in order to exclude the less relevant datasets, stored on partition 624 of the slower data storage 622, from results that are returned to Joe.

The modified database query 604 includes both (a) the criterion requiring the value "California" under the "State" data field and (b) the filter requiring a value equal to or greater than 2000 under the "Last Sale Year" data field. As illustrated, both the criterion and the filter are expressed in WHERE clauses.

A query execution engine selects partitions that are relevant to the modified database query 604. The query execution engine determines that the "Last Sale Year" data field is a partitioning key of Database X 610. The query execution engine determines that values equal to or greater than 2000, under the "Last Sale Year" data field, correspond to partition 614. The query execution engine determines that values less than 2000, under the "Last Sale Year" data field, correspond to partition 624.

The query execution engine determines that there is an overlap between (a) the range of values, under the "Last Sale Year" data field, specified by the modified database query 604 and (b) the range of values, under the "Last Sale Year" data field, corresponding to partition 614. Therefore, the query execution engine determines that partition 614 is relevant to the modified database query 604.

The query execution engine determines that there is no overlap between (a) the range of values, under the "Last Sale Year" data field, specified by the modified database query 604 and (b) the range of values, under the "Last Sale Year" data field, corresponding to partition 624. Therefore, the query execution engine determines that partition 624 is not relevant to the modified database query 604.

The query execution engine executes the modified database query 604 on partition 614 without traversing partition 624. The query execution engine looks up an index corresponding to partition 614. Based on the index, the query execution engine identifies that dataset 616 matches the modified database query 604. The query execution engine returns a set of results that includes dataset 616. The set of results does not include dataset 626.

By modifying the initial database query 602 to limit results to datasets within partition 614, the slower data storage 622 is not accessed. Therefore, the time needed for executing the modified database query 604 is less than the time needed for executing the initial database query 602. The adverse effect on the performance of Database X 610 of archiving older datasets are on the slower, less expensive data storage 622 is reduced. Further, although a subset of results for the initial database query 602 has been excluded, the datasets that are more important to Joe are still returned to Joe.

In other examples, the query modification engine determines whether there is a modification for a database query received from a particular application. Different modifications may correspond to different users, applications, and/or other sources. One modification may filter the database based on a particular data field. Another modification may filter the database based on an additional or alternative data field.

11. Cloud Environments

In one or more embodiments, a cloud environment provides a pool of resources that are shared amongst multiple client devices. The pool of resources may be geographically centralized and/or distributed. Examples of resources include a processor, a server, a data storage, a virtual machine, and a platform. Client devices may independently request computing services, such as server time and network storage, as needed. The resources are dynamically assigned to the requests and/or client devices on an on-demand basis. The resources assigned to each particular client device may be scaled up or down based on the computing services requested by the particular client device. The resources assigned to each particular client device may also be scaled up or down based on the aggregated demand for computing services requested by all client devices.

In an embodiment, the resources of a cloud environment are accessible over a network, such as a private network or the Internet. One or more physical and/or virtual client devices demanding use of the resources may be local to or remote from the resources. The client devices may be any type of computing devices, such as computers or smartphones, executing any type of operating system. The client devices communicate requests to the resources using a communications protocol, such as Hypertext Transfer Protocol (HTTP). The requests are communicated to the resources through an interface, such as a client interface (such as a web browser), a program interface, or an application programming interface (API).

In an embodiment, a cloud service provider provides a cloud environment to one or more cloud users. Various service models may be implemented by the cloud environment, including but not limited to Software-as-a-Service (SaaS), Platform-as-a-Service (PaaS), Infrastructure-as-a-Service (IaaS), and Database-as-a-Service (DBaaS). In SaaS, a cloud service provider provides cloud users the capability to use the cloud service provider's applications, which are executing on the cloud resources. In PaaS, the cloud service provider provides cloud users the capability to deploy onto the cloud resources custom applications, which are created using programming languages, libraries, services, and tools supported by the cloud service provider. In IaaS, the cloud service provider provides cloud users the capability to provision processing, storage, networks, and other fundamental computing resources provided in the cloud environment. Any arbitrary applications, including an operating system, may be deployed on the cloud resources. In DBaaS, the cloud service provider provides cloud users the capability to use database services provided in the cloud environment.

In an embodiment, various deployment models may be implemented by a cloud environment, including but not limited to a private cloud, a public cloud, and a hybrid cloud. In a private cloud, cloud resources are provisioned for exclusive use by a particular group of one or more entities (the term "entity" as used herein refers to a corporation, organization, person, or other entity). The cloud resources may be located on the premises of one or more entities in the particular group, and/or at one or more remote off-premise locations. In a public cloud, cloud resources are provisioned for multiple entities (also referred to herein as "tenants"). Several tenants may use a same particular resource, such as a server, at different times and/or at the same time. In a hybrid cloud, the cloud environment comprises a private cloud and a public cloud. An interface between the private cloud and the public cloud allows for data and application portability. Data stored at the private cloud and data stored at the public cloud may be exchanged through the interface. Applications implemented at the private cloud and applications implemented at the public cloud may have dependencies on each other. A call from an application at the private cloud to an application at the public cloud (and vice versa) may be executed through the interface.

In a multi-tenant environment, where multiple tenants share a same pool of resources, tenant isolation is implemented. Each tenant corresponds to a unique tenant identifiers (IDs). Data sets and/or applications implemented on cloud resources that are associated with a particular tenant are tagged with the tenant ID of the particular tenant. Before access to a particular data set or application is permitted, the tenant ID is verified to determine whether the corresponding tenant has authorization to access the particular data set or application.

In an embodiment, data sets corresponding to various tenants are stored as entries in a database. Each entry is tagged with the tenant ID of the corresponding tenant. A request for access to a particular data set is tagged with the tenant ID of the tenant making the request. The tenant ID associated with the request is checked against the tenant ID associated with the database entry of the data set to be accessed. If the tenant IDs are the same, then access to the database entry is permitted.

In an embodiment, data sets corresponding to various tenants are stored in different databases or data structures. Each database or data structure is tagged with the tenant ID of the corresponding tenant. A request for access to a particular data set is tagged with the tenant ID of the tenant making the request. The tenant ID associated with the request is checked against the tenant ID associated with the database or data structure storing the data set to be accessed. If the tenant IDs are the same, then access to the database or data structure is permitted.

In an embodiment, a subscription list indicates which tenants have authorization to access which applications. For each application, a list of tenant IDs of each tenant having authorization to access the application is stored. A request for access to a particular application is tagged with the tenant ID of the tenant making the request. The tenant ID associated with the request is checked against the subscription list to determine whether the tenant is authorized to access the application. If the tenant ID associated with the request is included in the list of tenant IDs of tenants having authorization to access the application, then access to the application is permitted.

In an embodiment, data sets and virtual resources (e.g., virtual machines, application instances, and threads) corresponding to different tenants are isolated to tenant-specific overlay networks maintained by the cloud environment. As an example, packets from any source device in a tenant overlay network may only be transmitted to other devices within the same tenant overlay network. Encapsulation tunnels are used to prohibit any transmissions from a source device on a tenant overlay network to devices in other tenant overlay networks. Specifically, the packets, received from the source device, are encapsulated within an outer packet. The outer packet is transmitted from a first encapsulation tunnel endpoint (in communication with the source device in the tenant overlay network) to a second encapsulation tunnel endpoint (in communication with the destination device in the tenant overlay network). The second encapsulation tunnel endpoint decapsulates the outer packet to obtain the original packet transmitted by the source device. The original packet is transmitted from the second encapsulation tunnel endpoint to the destination device in the same particular overlay network.

12. Miscellaneous; Extensions

Embodiments are directed to a system with one or more devices that include a hardware processor and that are configured to perform any of the operations described herein and/or recited in any of the claims below.

In an embodiment, a non-transitory computer readable storage medium comprises instructions which, when executed by one or more hardware processors, causes performance of any of the operations described herein and/or recited in any of the claims.

Any combination of the features and functionalities described herein may be used in accordance with one or more embodiments. In the foregoing specification, embodiments have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

13. Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

For example, FIG. 7 is a block diagram that illustrates a computer system 700 upon which an embodiment of the invention may be implemented. Computer system 700 includes a bus 702 or other communication mechanism for communicating information, and a hardware processor 704 coupled with bus 702 for processing information. Hardware processor 704 may be, for example, a general purpose microprocessor.

Computer system 700 also includes a main memory 706, such as a random access memory (RAM) or other dynamic storage device, coupled to bus 702 for storing information and instructions to be executed by processor 704. Main memory 706 also may be used for storing temporary variables or other intermediate information during execution of instructions to be executed by processor 704. Such instructions, when stored in non-transitory storage media accessible to processor 704, render computer system 700 into a special-purpose machine that is customized to perform the operations specified in the instructions.

Computer system 700 further includes a read only memory (ROM) 708 or other static storage device coupled to bus 702 for storing static information and instructions for processor 704. A storage device 710, such as a magnetic disk or optical disk, is provided and coupled to bus 702 for storing information and instructions.

Computer system 700 may be coupled via bus 702 to a display 712, such as a cathode ray tube (CRT), for displaying information to a computer user. An input device 714, including alphanumeric and other keys, is coupled to bus 702 for communicating information and command selections to processor 704. Another type of user input device is cursor control 716, such as a mouse, a trackball, or cursor direction keys for communicating direction information and command selections to processor 704 and for controlling cursor movement on display 712. This input device typically has two degrees of freedom in two axes, a first axis (e.g., x) and a second axis (e.g., y), that allows the device to specify positions in a plane.

Computer system 700 may implement the techniques described herein using customized hard-wired logic, one or more ASICs or FPGAs, firmware and/or program logic which in combination with the computer system causes or programs computer system 700 to be a special-purpose machine. According to one embodiment, the techniques herein are performed by computer system 700 in response to processor 704 executing one or more sequences of one or more instructions contained in main memory 706. Such instructions may be read into main memory 706 from another storage medium, such as storage device 710. Execution of the sequences of instructions contained in main memory 706 causes processor 704 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 710. Volatile media includes dynamic memory, such as main memory 706. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 702. Transmission media can also take the form of acoustic or light waves, such as those generated during radio-wave and infra-red data communications.

Various forms of media may be involved in carrying one or more sequences of one or more instructions to processor 704 for execution. For example, the instructions may initially be carried on a magnetic disk or solid state drive of a remote computer. The remote computer can load the instructions into its dynamic memory and send the instructions over a telephone line using a modem. A modem local to computer system 700 can receive the data on the telephone line and use an infra-red transmitter to convert the data to an infra-red signal. An infra-red detector can receive the data carried in the infra-red signal and appropriate circuitry can place the data on bus 702. Bus 702 carries the data to main memory 706, from which processor 704 retrieves and executes the instructions. The instructions received by main memory 706 may optionally be stored on storage device 710 either before or after execution by processor 704.

Computer system 700 also includes a communication interface 718 coupled to bus 702. Communication interface 718 provides a two-way data communication coupling to a network link 720 that is connected to a local network 722. For example, communication interface 718 may be an integrated services digital network (ISDN) card, cable modem, satellite modem, or a modem to provide a data communication connection to a corresponding type of telephone line. As another example, communication interface 718 may be a local area network (LAN) card to provide a data communication connection to a compatible LAN. Wireless links may also be implemented. In any such implementation, communication interface 718 sends and receives electrical, electromagnetic or optical signals that carry digital data streams representing various types of information.

Network link 720 typically provides data communication through one or more networks to other data devices. For example, network link 720 may provide a connection through local network 722 to a host computer 724 or to data equipment operated by an Internet Service Provider (ISP) 726. ISP 726 in turn provides data communication services through the world wide packet data communication network now commonly referred to as the "Internet" 728. Local network 722 and Internet 728 both use electrical, electromagnetic or optical signals that carry digital data streams. The signals through the various networks and the signals on network link 720 and through communication interface 718, which carry the digital data to and from computer system 700, are example forms of transmission media.

Computer system 700 can send messages and receive data, including program code, through the network(s), network link 720 and communication interface 718. In the Internet example, a server 730 might transmit a requested code for an application program through Internet 728, ISP 726, local network 722 and communication interface 718.

The received code may be executed by processor 704 as it is received, and/or stored in storage device 710, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A non-transitory computer readable medium comprising instructions which, when executed by one or more hardware processors, causes performance of operations comprising:
    receiving a database query for execution on a database;
    identifying a source corresponding to the database query;
    selecting a modification of the database query based on the source;
    applying the modification to the database query to obtain a modified database query;
    selecting one or more partitions, from a plurality of partitions of the database, that are relevant to the modified database query based on a partitioning key associated with the database; and
    executing the modified database query on the selected partitions, without executing the modified database query on the non-selected partitions, to obtain a first set of results.

2. The medium of claim 1, wherein the database query does not explicitly specify the source.

3. The medium of claim 1, wherein identifying the source corresponding to the database query comprises: identifying a user or an application that generated the database query.

4. The medium of claim 1, wherein identifying the source corresponding to the database query comprises: identifying a user or an application from which the database query was received.

5. The medium of claim 1, wherein selecting the modification of the database query based on the source comprises: executing a function using the source as an input to the function.

6. The medium of claim 1, wherein selecting the modification of the database query based on the source comprises: mapping the source to one or more criteria to filter the database.

7. The medium of claim 1, wherein applying the modification to the database query to obtain a modified database query comprises: appending or modifying a filter to the database query.

8. The medium of claim 1, wherein the operations further comprise: prior to receiving the database query:
    receiving a selection of a first type of data storage for storing data associated with the source;
    forming the selected partitions on a first data storage of the first type; and
    forming the non-selected partitions on a second data storage of a second type different than the first type.

9. The medium of claim 1, wherein the operations further comprise: prior to receiving the database query:
    receiving a selection of a first tier of data storage, in a data tiering system, for storing data associated with the source;
    forming the selected partitions on a first data storage of the first tier; and
    forming the non-selected partitions on a second data storage of a second tier different than the first tier.

10. The medium of claim 1, wherein the operations further comprise: prior to receiving the database query:
    receiving a selection of a first level of compression for storing data associated with the source;
    forming the selected partitions on a first data storage using the first level of compression; and
    forming the non-selected partitions on a second data storage using a second level of compression different than the first level of compression.

11. The medium of claim 1, wherein:
    the modification to the database query comprises a filter based on one or more criteria specified by a system; and
    the database query is received from a user interface or application that does not include functionality to generate the filter based on the one or more criteria.

12. The medium of claim 1, wherein the operations further comprise:
    prior to receiving the database query:
        receiving a request to test functionality or performance of a database with a dataset, currently stored in a first partition, being purged from the first partition; and
        responsive to receiving the request: transferring the dataset from the first partition to a second partition;
        wherein executing the modified database query does not result in retrieval of the dataset from the second partition.

13. The medium of claim 1, wherein the operations further comprise:
    receiving a request to test functionality or performance of a database with a dataset, currently stored in a first partition, being archived to a second partition;
    responsive to receiving the request: copying the dataset from the first partition to the second partition, without deleting the dataset from the first partition;
    receiving a second database query for the dataset;
    applying a modification to the second database query to obtain a modified second database query;
    executing the modified second database query, wherein executing the modified second database query comprises:
        determining that the modified second database query is relevant to the second partition and not the first partition; and
        executing the modified second database query on the second partition.

14. The medium of claim 1, wherein:
    the database query does not explicitly specify the source;
    identifying the source corresponding to the database query comprises:

identifying a user that generated the database query;
identifying an application that submitted the database query, wherein the application does not include functionality to submit any database queries that filter the database based on a particular criterion;
selecting the modification of the database query based on the source comprises: mapping the source to the particular criterion for filtering the database;
applying the modification to the database query to obtain a modified database query comprises:
   appending, to the database query, a filter based on the particular criterion; and
the operations further comprise:
   prior to receiving the database query:
      receiving a selection of a first type of data storage for storing data associated with the source;
      forming the selected partitions on a first data storage of the first type; and
      forming the non-selected partitions on a second data storage of a second type different than the first type.

15. A system, comprising:
at least one hardware device including a processor; and
the system configured to perform operations comprising:
receiving a database query for execution on a database;
identifying a source corresponding to the database query;
selecting a modification of the database query based on the source;
applying the modification to the database query to obtain a modified database query;
selecting one or more partitions, from a plurality of partitions of the database, that are relevant to the modified database query based on a partitioning key associated with the database; and
executing the modified database query on the selected partitions, without executing the modified database query on the non-selected partitions, to obtain a first set of results.

16. The system of claim 15, wherein the database query does not explicitly specify the source.

17. The system of claim 15, wherein identifying the source corresponding to the database query comprises: identifying a user or an application that generated the database query.

18. The system of claim 15, wherein identifying the source corresponding to the database query comprises: identifying a user or an application from which the database query was received.

19. A method, comprising:
receiving a database query for execution on a database;
identifying a source corresponding to the database query;
selecting a modification of the database query based on the source;
applying the modification to the database query to obtain a modified database query;
selecting one or more partitions, from a plurality of partitions of the database, that are relevant to the modified database query based on a partitioning key associated with the database; and
executing the modified database query on the selected partitions, without executing the modified database query on the non-selected partitions, to obtain a first set of results;
wherein the method is performed by at least one device including a hardware processor.

20. The method of claim 19, wherein the database query does not explicitly specify the source.

* * * * *